US008413027B2

(12) United States Patent
Lapstun et al.

(10) Patent No.: US 8,413,027 B2
(45) Date of Patent: Apr. 2, 2013

(54) METHOD OF DECODING A PATTERN-ENCODED COORDINATE

(75) Inventors: Paul Lapstun, Balmain (AU); Jonathon Leigh Napper, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 556 days.

(21) Appl. No.: 12/694,272

(22) Filed: Jan. 27, 2010

(65) Prior Publication Data
US 2011/0185266 A1 Jul. 28, 2011

(51) Int. Cl.
*H03M 13/00* (2006.01)
*G06F 3/041* (2006.01)
*G06F 3/033* (2006.01)

(52) U.S. Cl. ............ 714/784; 178/18.01; 345/179; 714/785

(58) Field of Classification Search .......... 714/784, 714/785; 345/179; 178/18.01, 18.09; 235/437
See application file for complete search history.

(56) References Cited

U.S. PATENT DOCUMENTS

| | | | |
|---|---|---|---|
| 4,703,511 A * | 10/1987 | Conoval ............... | 382/182 |
| 4,864,618 A | 9/1989 | Wright et al. | |
| 5,051,736 A | 9/1991 | Bennett et al. | |
| 5,159,664 A * | 10/1992 | Yamamoto et al. ..... | 345/629 |
| 5,477,012 A | 12/1995 | Sekendur | |
| 5,642,202 A * | 6/1997 | Williams et al. ......... | 358/406 |
| 5,652,412 A | 7/1997 | Lazzouni et al. | |
| 5,661,506 A | 8/1997 | Lazzouni et al. | |
| 5,692,073 A | 11/1997 | Cass | |
| 5,852,434 A | 12/1998 | Sekendur | |
| 6,076,734 A | 6/2000 | Dougherty et al. | |
| 7,175,088 B2 * | 2/2007 | Kim et al. .................. | 235/460 |
| 2006/0193522 A1 * | 8/2006 | Sonoda et al. ............ | 382/232 |
| 2011/0180614 A1 * | 7/2011 | Lapstun et al. ........... | 235/494 |

FOREIGN PATENT DOCUMENTS

| | | |
|---|---|---|
| GB | 2306669 A | 5/1997 |
| WO | WO 99/18487 A2 | 4/1999 |
| WO | WO 99/50787 A1 | 10/1999 |

OTHER PUBLICATIONS

Bahmani, S.; Bajic, I.V.; HajShirMohammadi, A.; , "Joint source-chanel decoding of JPEG2000 images with unequal loss protection," Acoustics, Speech and Signal Processing, 2008. ICASSP 2008. IEEE International Conference on , vol., No., pp. 1365-1368, Mar. 31, 2008-Apr. 4, 2008.*

Lim, F.; Fossorier, M.; Kavčić, A.; , "Permutation decoding the binary images of certain double-parity reed-solomon codes," Information Theory Proceedings (ISIT), 2010 IEEE Internationl Symposium on , vol., No., pp. 1085-1089, Jun. 13-18, 2010.*

Forney, G.D., Jr.; , "Codes on graphs: normal realizations," Information Theory, IEEE Transactions on , vol. 47, No. 2, pp. 520-548, Feb. 2001.*

Dymetman, M., and Copperman, M., "Intelligent Paper in Electronic Publishing, Artist Imaging, and Digital Typography, Proceedings of EP '98", Mar./Apr. 1998, Springer Verlag LNCS 1375, pp. 392-406.

* cited by examiner

*Primary Examiner* — Cynthia Britt

(57) ABSTRACT

A method of decoding a coding pattern disposed on or in a substrate. The method comprises the steps of: (a) operatively positioning an optical reader relative to a surface of the substrate; (b) capturing an image of a portion of the coding pattern, the coding pattern comprising a plurality of square tags of length/identifying two-dimensional location coordinates; and (c) sampling and decoding x-coordinate data symbols within the imaged portion and y-coordinate data symbols within the imaged portion. The imaged portion has a predetermined diameter and is guaranteed to contain sufficient data symbols from each of the Reed-Solomon codes so that symbol errors are correctable in each of the codes during the decoding.

20 Claims, 18 Drawing Sheets

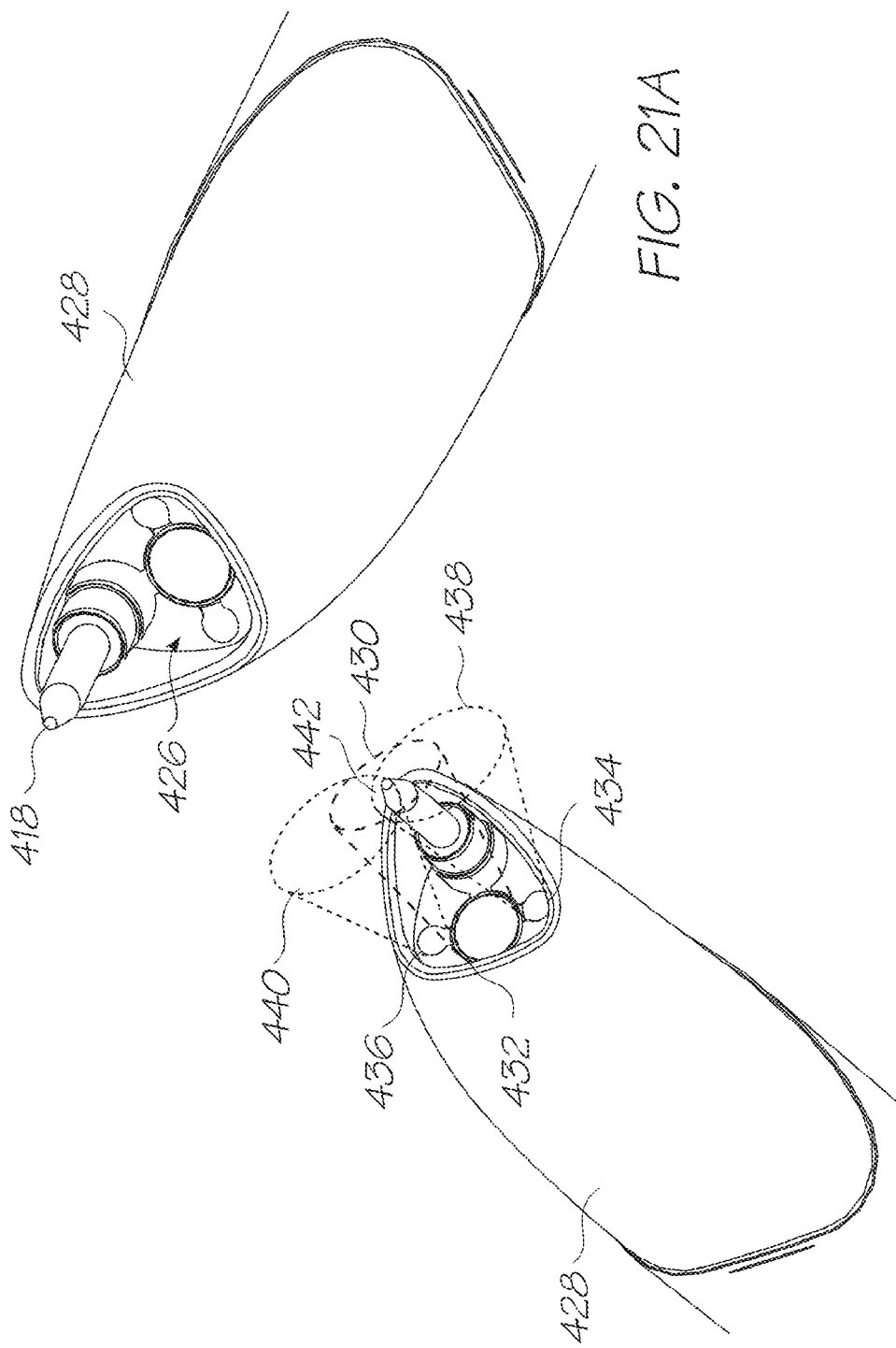

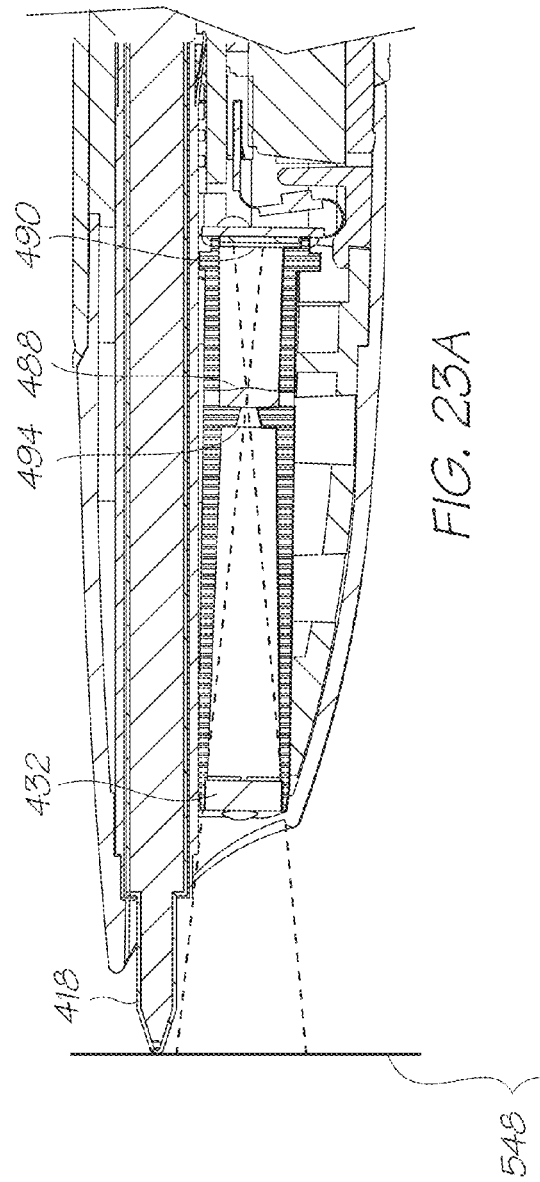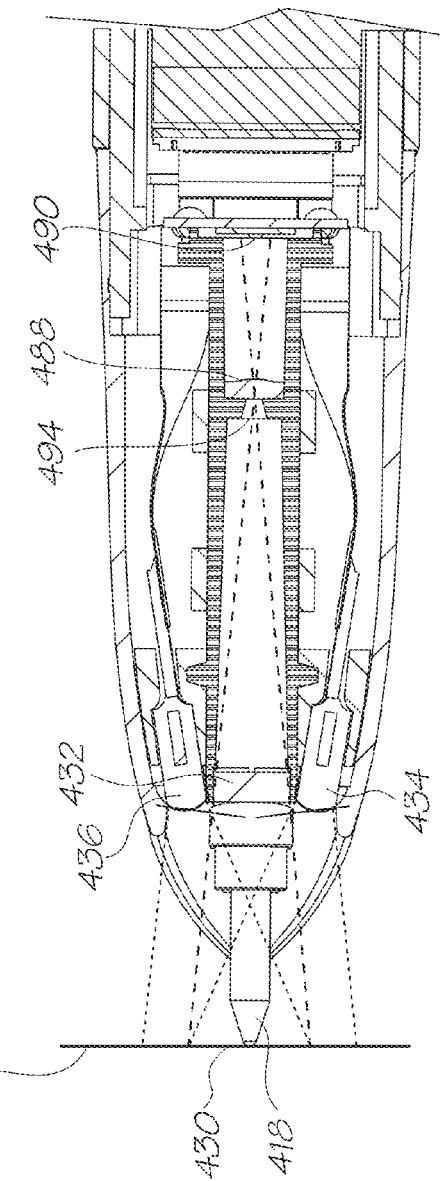

METHOD OF DECODING A PATTERN-ENCODED COORDINATE

FIELD OF INVENTION

The present invention relates to a position-coding pattern on a surface.

COPENDING APPLICATIONS

The following applications have been filed by the Applicant simultaneously with the present application:

| | | | | |
|---|---|---|---|---|
| NPT118US | NPT119US | NPT120US | NPT121US | NPT122US |
| NPT123US | NPT124US | NPT125US | NPT127US | NPT128US |
| NPT129US | | | | |

The disclosures of these co-pending applications are incorporated herein by reference. The above applications have been identified by their filing docket number, which will be substituted with the corresponding application number, once assigned.

CROSS REFERENCES

The following patents or patent applications filed by the applicant or assignee of the present invention are hereby incorporated by cross-reference.

| | | | | |
|---|---|---|---|---|
| 10/815,621 | 10/815,635 | 10/815,647 | 11/488,162 | 10/815,636 |
| 11/041,652 | 11/041,609 | 11/041,556 | 10/815,609 | 7,204,941 |
| 7,278,727 | 10/913,380 | 7,122,076 | 7,156,289 | 09/575,197 |
| 6,720,985 | 7,295,839 | 09/722,174 | 7,068,382 | 7,094,910 |
| 7,062,651 | 6,644,642 | 6,549,935 | 6,987,573 | 6,727,996 |
| 6,760,119 | 7,064,851 | 6,290,349 | 6,428,155 | 6,785,016 |
| 6,831,682 | 6,741,871 | 6,965,439 | 10/932,044 | 6,870,966 |
| 6,474,888 | 6,724,374 | 6,788,982 | 7,263,270 | 6,788,293 |
| 6,737,591 | 09/693,514 | 10/778,056 | 10/778,061 | 11/193,482 |
| 7,055,739 | 6,830,196 | 7,182,247 | 7,082,562 | 10/409,864 |
| 7,108,192 | 10/492,169 | 10/492,152 | 10/492,168 | 10/492,161 |
| 7,308,148 | 6,957,768 | 7,170,499 | 11/856,061 | 11/672,522 |
| 11/672,950 | 11/754,310 | 12/015,507 | 7,148,345 | 12/025,746 |
| 12/025,762 | 12/025,765 | 10/407,212 | 6,902,255 | 6,755,509 |
| 12/178,611 | 12/178,619 | | | |

BACKGROUND

The Applicant has previously described a method of enabling users to access information from a computer system via a printed substrate e.g. paper. The substrate has a coding pattern printed thereon, which is read by an optical sensing device when the user interacts with the substrate using the sensing device. A computer receives interaction data from the sensing device and uses this data to determine what action is being requested by the user. For example, a user may make handwritten input onto a form or make a selection gesture around a printed item. This input is interpreted by the computer system with reference to a page description corresponding to the printed substrate.

It would desirable to improve the coding pattern on the substrate so as to maximize the data capacity of the coding pattern and minimize the overall visibility of the coding pattern on the substrate. The coding pattern typically comprises data symbols (encoding 'useful' information, such as an identity and/or a location) and as well as other symbols, which allow the data symbols to be decoded. It would be desirable to minimize the amount of data encoded in these other symbols so as to make maximum use of the data symbols. By minimizing the space occupied by these other symbols, there is more space available in the coding pattern for data symbols which encode useful information.

It would be further desirable to distribute coordinate data symbols so as to maximize the error-correcting capacity of the code. In particular, it would be desirable to provide maximum robustness even when, for example, the coding pattern is scratched with horizontal or vertical lines (e.g. if the coding pattern is co-printed with form field boxes containing horizontal and vertical lines, which potentially affect the readability of the coding pattern).

SUMMARY OF INVENTION

In a first aspect, there is provided a substrate having a coding pattern disposed thereon or therein, said coding pattern comprising a plurality of square tags of length l identifying two-dimensional location coordinates, each tag comprising:

a plurality $n_1$ of x-coordinate data symbols encoding a respective $(n_2, k)$ Reed-Solomon code for an x-coordinate;

a plurality $n_1$ of y-coordinate data symbols encoding a respective $(n_2, k)$ Reed-Solomon code for a y-coordinate;

a number z of said x-coordinate data symbols positioned in a central column of width q in each tag with a remaining $(n_1-z)$ x-coordinate data symbols distributed evenly on either side of said central column; and a number z of said y-coordinate data symbols positioned in a central row of said tag of width q with a remaining $(n_1-z)$ y-coordinate data symbols distributed evenly above and below said central row;

wherein $n_1 \geq n_2$ and $z \geq 1$, such that any square portion of said coding pattern of length $(l+q)$ is guaranteed to contain at least $(n_1+z)/2$ data symbols from each of said Reed-Solomon codes.

The distribution of coordinate data symbols in the coding pattern defined in connection with the first aspect provides excellent robustness in the presence of errors, particularly errors resulting from defects in horizontal or vertical lines in the coding pattern.

Optionally, $n_1=n_2$ and none of said x-coordinate or y-coordinate data symbols is replicated within each tag.

Optionally, $n_2>2k$.

Optionally, $z \geq k$.

Optionally, each of said Reed-Solomon codes is a natural full-length code or a shortened code.

Optionally, z is from 1 to 253, optionally from 1 to 15 or optionally from 2 to 7, or optionally from 2 to 5.

Optionally, k is from 1 to 253; optionally from 1 to 15 or optionally from 2 to 9, or optionally from 2 to 5. Optionally $z=k\pm2$, $z=k\pm1$ or $z=k$.

Optionally, $n_1$ is from 3 to 255, optionally from 3 to 31, optionally from 3 to 15, or optionally from 3 to 9.

Optionally, $n_2$ is from 2 to 255, optionally from 3 to 31, optionally from 3 to 15, or optionally from 3 to 9.

Optionally, up to 126 symbol errors are corrected during said decoding. Optionally, at least 1, at least 2, at least 3, at least 4, at least 5, at least 6, at least 7, at least 8 or at least 9 symbol errors are corrected during said decoding.

Optionally, each data symbol is encoded using multi-pulse position modulation.

Optionally, each data symbol is represented by d macrodots, each of said d macrodots occupying a respective position from a plurality of predetermined possible positions p, the respective positions of said d macrodots representing one of a plurality of possible data values, wherein p>d.

Optionally, d is an integer value of 2 to 6 and p is an integer value of 4 to 12. Typically, p is 7 and d is either 2 or 3, corresponding to a 2-7 PPM or 3-7 PPM encoding of data symbols.

Optionally, each data symbol provides i possible symbol values, and wherein any unused symbol values are treated as erasures.

Optionally, each of data symbol provides i possible symbol values for a j-bit symbol, wherein $(i-2^j)$ unused symbol values are treated as erasures.

Optionally, d=3 and p=7 which provides 35 possible symbol values for a 5-bit data symbol, wherein 3 unused symbol values are treated as erasures.

Optionally, d=2 and p=7 which provides 21 possible symbol values for a 4-bit data symbol, wherein 5 unused symbol values are treated as erasures.

Optionally, q=2 s, 3 s, 4 s or 5 s, wherein s is defined as a spacing between adjacent macrodots.

Optionally, said coding pattern comprises a plurality of target elements defining a target grid, said target grid comprising a plurality of grid cells, wherein neighboring grid cells share target elements and wherein each tag is defined by a plurality of contiguous grid cells.

Optionally, each tag comprises $M^2$ contiguous square grid cells, wherein M is an integer. Optionally, M is an integer having a value of 2, 3, 4, 5 or 6.

Optionally, each grid cell defines a symbol group containing a plurality of data symbols, wherein each symbol group comprises at least one of said x-coordinate symbols and/or at least one of said y-coordinate symbols.

Optionally, each tag comprises one or more common Reed-Solomon codewords, each common codeword being common to a plurality of contiguous tags, each common codeword comprising a respective set of common data symbols.

Optionally, each common codeword, or a set of common codewords, identifies an identity. The identity typically identifies at least one of: the substrate; a region; a page; a product; a visual layout; and an interactivity layout.

Optionally, each symbol group comprises one or more registration symbols, said registration symbols identifying one or more of:
 a tag encoding format;
 a translation of a symbol group relative to a tag containing said symbol group;
 an orientation of a layout of said data symbols with respect to said target grid; and
 a flag.

Optionally, said tag encoding format identifies a number of macrodots contained in each data symbol of said coding pattern.

In a second aspect, there is provided a method of decoding a coding pattern disposed on or in a substrate, said method comprising the steps of:
 (a) operatively positioning an optical reader relative to a surface of said substrate;
 (b) capturing an image of a portion of said coding pattern, said coding pattern comprising a plurality of square tags of length/identifying two-dimensional location coordinates, each tag comprising:
  a plurality $n_1$ of x-coordinate data symbols encoding a respective $(n_2, k)$ Reed-Solomon code for an x-coordinate;
  a plurality $n_1$ of y-coordinate data symbols encoding a respective $(n_2, k)$ Reed-Solomon code for a y-coordinate;
  a number z of said x-coordinate data symbols positioned in a central column of width q in each tag with a remaining $(n_1-z)$ x-coordinate data symbols distributed evenly on either side of said central column; and
  a number z of said y-coordinate data symbols positioned in a central row of said tag of width q with a remaining $(n_1-z)$ y-coordinate data symbols distributed evenly above and below said central row, wherein $n_1 \geq n_2$ and $z \geq 1$;
 (c) sampling and decoding at least one of:
  x-coordinate data symbols within said imaged portion; and
  y-coordinate data symbols within said imaged portion,
wherein said imaged portion has a diameter of at least $(1+q)\sqrt{2}$ and less than $(2l)\sqrt{2}$ and is guaranteed to contain at least $(n_1+z)/2$ data symbols from each of said Reed-Solomon codes, and wherein one or more symbol errors are correctable in each of said codes during said decoding.

Optionally, said imaged portion has a diameter of at least $(1+q)\sqrt{2}$ and less than $(2l)\sqrt{2}$ and is guaranteed to contain at least $(n_1+z)/2$ coordinate data symbols from each of said local Reed-Solomon codes.

Optionally, said sampled x-coordinate data symbols and y-coordinate data symbols within said imaged portion define respective sampled x-coordinate and y-coordinate codewords, and wherein any missing coordinate data symbols from respective $(n_2, k)$ Reed-Solomon codes are treated as erasures in said sampled codewords.

Optionally, a number of said missing coordinate data symbols from respective $(n_2, k)$ Reed-Solomon codes varies from 0 to $(n_1-z)/2$ depending on an alignment of said imaged portion with a tag to be decoded.

Optionally, each tag comprises one or more common Reed-Solomon codewords identifying a region identity associated with said surface, each common codeword being common to a plurality of contiguous tags and each common codeword comprising a respective set of common data symbols, wherein said method comprises the further steps of:
 sampling and decoding common data symbols within said imaged portion; and
 determining a region identity using said decoded common data symbols Optionally, each symbol group comprises one or more registration symbols, said registration symbols identifying one or more of:
 a tag encoding format;
 a translation of a symbol group relative to a tag containing said symbol group;
 an orientation of a layout of said data symbols with respect to said target grid; and
 a flag,
wherein said method comprises the further step of:
 sampling and decoding registration symbols within the imaged portion; and
 using the decoded registration symbols to decode the x-coordinate data symbols and y-coordinate data symbols Optionally, said method comprises the further step of:
 using the decoded registration symbols to determine a tag encoding format for said coding pattern, said tag encoding format identifying a number of macrodots contained in each of said data symbols.

Optionally, said method comprises the further step of:
 using the decoded registration symbols to determine whether at least one tag within said imaged portion is flagged or unflagged; and
 providing feedback to a user in the event that the tag is flagged.

In a third aspect, there is provided a system for decoding a coding pattern, said system comprising:

(A) a substrate having a coding pattern disposed thereon or therein, said coding pattern comprising a plurality of square tags of length/identifying two-dimensional location coordinates, each tag comprising:

a plurality $n_1$ of x-coordinate data symbols encoding a respective $(n_2, k)$ Reed-Solomon code for an x-coordinate;

a plurality $n_1$ of y-coordinate data symbols encoding a respective $(n_2, k)$ Reed-Solomon code for a y-coordinate;

a number z of said x-coordinate data symbols positioned in a central column of width q in each tag with a remaining $(n_1-z)$ x-coordinate data symbols distributed evenly on either side of said central column; and a number z of said y-coordinate data symbols positioned in a central row of said tag of width q with a remaining $(n_1-z)$ y-coordinate data symbols distributed evenly above and below said central row, wherein $n_1 \geq n_2$ and $z \geq k$; and (B) an optical reader comprising:

an image sensor for capturing an image of a portion of said coding pattern, said image sensor having a field of view with a diameter of at least $(l+q)\sqrt{2}$ and less than $(2l)\sqrt{2}$; and a processor configured for performing the steps of:
(i) sampling at least $(n_1+z)/2$ data symbols from at least one of said Reed-Solomon codes; and
(ii) decoding at least one of: said x-coordinate data symbols within said imaged portion; and said y-coordinate data symbols within said imaged portion, wherein said processor is configured to correct one or more symbol errors in each of said codes when decoding said x-coordinate and y-coordinate data symbols.

In a fourth aspect, there is provided an optical reader for decoding a coding pattern disposed on or in a substrate, said coding pattern comprising a plurality of square tags of length l identifying two-dimensional location coordinates, each tag comprising:

a plurality $n_1$ of x-coordinate data symbols encoding a respective $(n_2, k)$ Reed-Solomon code for an x-coordinate;

a plurality $n_1$ of y-coordinate data symbols encoding a respective $(n_2, k)$ Reed-Solomon code for a y-coordinate;

a number z of said x-coordinate data symbols positioned in a central column of width q in each tag with a remaining $(n_1-z)$ x-coordinate data symbols distributed evenly on either side of said central column; and a number z of said y-coordinate data symbols positioned in a central row of said tag of width q with a remaining $(n_1-z)$ y-coordinate data symbols distributed evenly above and below said central row, wherein $n_1 \geq n_2$ and $z \geq k$;

said optical reader comprising:

an image sensor for capturing an image of a portion of said coding pattern, said image sensor having a field of view with a diameter of at least $(l+q)\sqrt{2}$ and less than $(2l)\sqrt{2}$; and a processor configured for performing the steps of:
(i) sampling at least $(n_1+z)/2$ data symbols from at least one of said Reed-Solomon codes; and
(ii) decoding at least one of: said x-coordinate data symbols within said imaged portion; and said y-coordinate data symbols within said imaged portion, wherein said processor is configured to correct one or more symbol errors in each of said codes when decoding said x-coordinate and y-coordinate data symbols.

In a fifth aspect, there is provided a method of decoding a coding pattern disposed on or in a substrate, said method comprising the steps of:

(a) operatively positioning an optical reader relative to a surface of said substrate;

(b) capturing an image of a portion of said coding pattern, said coding pattern comprising a plurality of tags, each tag comprising:

a plurality $n_1$ of local data symbols encoding a local $(n_2, k)$ Reed-Solomon code for said tag, wherein $n_1 \geq n_2$;

(c) sampling a plurality of said local data symbols within said imaged portion, said plurality of sampled local data symbols defining at least part of a sampled local codeword;

(d) identifying $n_3$ missing data symbols in said sampled local codeword, said missing data symbols being positioned at least partially outside said imaged portion; and (e) decoding said sampled local codeword by treating said $n_3$ missing data symbols as erasures, wherein $n_3$ varies depending on an alignment of said imaged portion with a tag to be decoded.

Optionally, only part of said tag to be decoded is contained within said imaged portion and $n_3$ is at least 1.

Optionally, 0, 1, 2, 3, 4 or 5 symbol errors are corrected during said decoding.

Optionally, $n_1=n_2$ and none of said local data symbols is replicated within each tag.

Optionally, said $n_3$ missing data symbols are identified using the alignment of the imaged portion with the tag to be decoded.

Optionally, $n_3$ varies between 0 and $n_{max}$ for all possible alignments, and wherein $n_{max}$ is determined by a diameter of said imaged portion and an arrangement of said local data symbols in each tag.

Optionally, $(n_2-n_{max})>k$.

Optionally, $n_{max}$ is from 2 to 15.

Optionally, each tag is a square tag of length l comprising:

a plurality $n_1$ of local x-coordinate data symbols encoding a respective local $(n_2, k)$ Reed-Solomon code for an x-coordinate;

a plurality $n_1$ of local y-coordinate data symbols encoding a respective local $(n_2, k)$ Reed-Solomon code for a y-coordinate;

a number z of said x-coordinate data symbols positioned in a central column of width q in each tag with a remaining $(n_1-z)$ x-coordinate data symbols distributed evenly on either side of said central column; and a number z of said y-coordinate data symbols positioned in a central row of said tag of width q with a remaining $(n_1-z)$ y-coordinate data symbols distributed evenly above and below said central row, wherein $n_1 \geq n_2$ and $z \geq k$.

Optionally, said imaged portion has a diameter of at least $(l+q)\sqrt{2}$ and less than $(2l)\sqrt{2}$ and is guaranteed to contain at least $(n_1+z)/2$ coordinate data symbols from each of said local Reed-Solomon codes.

Optionally, $n_{max}=(n_1-z)/2$.

In a sixth aspect, there is provided a system for decoding a coding pattern, said system comprising:

(A) a substrate having the coding pattern disposed thereon or therein, said coding pattern comprising a plurality of tags, each tag comprising:

a plurality $n_1$ of local data symbols encoding a local $(n_2, k)$ Reed-Solomon code for said tag, wherein $n_1 \geq n_2$; and (B) an optical reader comprising:

an image sensor for capturing an image of a portion of said coding pattern; and a processor configured for performing the steps of:
(i) sampling a plurality of said local data symbols within said imaged portion, said plurality of sampled local data symbols defining at least part of a sampled local codeword;

(ii) identifying $n_3$ missing data symbols in said sampled local codeword, said missing data symbols being positioned at least partially outside said imaged portion; and
(iii) decoding said sampled local codeword by treating said $n_3$ missing data symbols as erasures,
wherein $n_3$ varies depending on an alignment of said imaged portion with a tag to be decoded.

In a seventh aspect, there is provided an optical reader for decoding a coding pattern disposed on or in a substrate, said coding pattern comprising a plurality of tags, each tag comprising:
a plurality $n_1$ of local data symbols encoding a local ($n_2$, k) Reed-Solomon code for said tag, wherein $n_1 \geq n_2$;
said optical reader comprising:
an image sensor for capturing an image of a portion of said coding pattern; and
a processor configured for performing the steps of:
(i) sampling a plurality of said local data symbols within said imaged portion, said plurality of sampled local data symbols defining at least part of a sampled local codeword;
(ii) identifying $n_3$ missing data symbols in said sampled local codeword, said missing data symbols being positioned at least partially outside said imaged portion; and
(iii) decoding said sampled local codeword by treating said $n_3$ missing data symbols as erasures,
wherein $n_3$ varies depending on an alignment of said imaged portion with a tag to be decoded.

It will appreciated that one or more of the optional embodiments described herein may be equally applicable to any of the first, second, third, fourth, fifth, sixth or seventh aspects.

BRIEF DESCRIPTION OF DRAWINGS

Preferred and other embodiments of the invention will now be described, by way of non-limiting example only, with reference to the accompanying drawings, in which:

FIG. 21A is a bottom and nib end partial perspective of the pen;

FIG. 21B is a bottom and nib end partial perspective with the fields of illumination and field of view of the sensor window shown in dotted outline;

FIG. 23A is a partial longitudinal cross section of the nib and barrel molding;

FIG. 23B is a partial longitudinal cross section of the IR LED's and the barrel molding;

Figure 1:
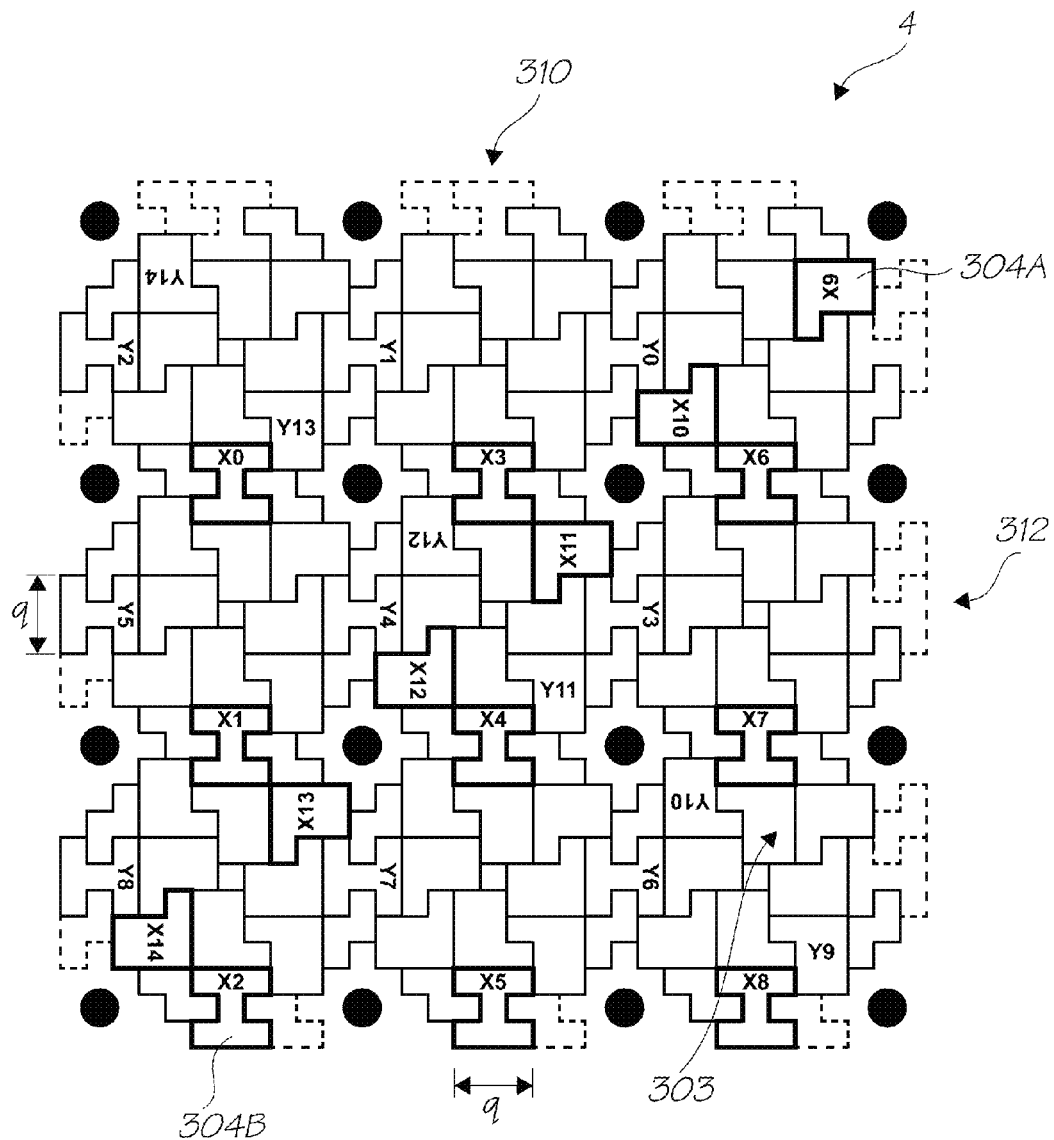
FIG. 1 shows a layout of coordinate codewords X and Y, with codeword X shown in bold outline.

DETAILED DESCRIPTION OF PREFERRED AND OTHER EMBODIMENTS 1.1 Netpage System Architecture In a preferred embodiment, the invention is configured to work with the netpage networked computer system, a detailed overview of which follows. It will be appreciated that not every implementation will necessarily embody all or even most of the specific details and extensions discussed below in relation to the basic system. However, the system is described in its most complete form to reduce the need for external reference when attempting to understand the context in which the preferred embodiments and aspects of the present invention operate.

In brief summary, the preferred form of the netpage system employs a computer interface in the form of a mapped surface, that is, a physical surface which contains references to a map of the surface maintained in a computer system. The map references can be queried by an appropriate sensing device. Depending upon the specific implementation, the map references may be encoded visibly or invisibly, and defined in such a way that a local query on the mapped surface yields an unambiguous map reference both within the map and among different maps. The computer system can contain information about features on the mapped surface, and such information can be retrieved based on map references supplied by a sensing device used with the mapped surface. The information thus retrieved can take the form of actions which are initiated by the computer system on behalf of the operator in response to the operator's interaction with the surface features.

In its preferred form, the netpage system relies on the production of, and human interaction with, netpages. These are pages of text, graphics and images printed on ordinary paper, but which work like interactive webpages. Information is encoded on each page using ink which is substantially invisible to the unaided human eye. The ink, however, and thereby the coded data, can be sensed by an optically imaging sensing device and transmitted to the netpage system. The sensing device may take the form of a clicker (for clicking on a specific position on a surface), a pointer having a stylus (for pointing or gesturing on a surface using pointer strokes), or a pen having a marking nib (for marking a surface with ink when pointing, gesturing or writing on the surface). References herein to "pen" or "netpage pen" are provided by way of example only. It will, of course, be appreciated that the pen may take the form of any of the sensing devices described above.

In one embodiment, active buttons and hyperlinks on each page can be clicked with the sensing device to request information from the network or to signal preferences to a network server. In one embodiment, text written by hand on a netpage is automatically recognized and converted to computer text in the netpage system, allowing forms to be filled in. In other embodiments, signatures recorded on a netpage are automatically verified, allowing e-commerce transactions to be securely authorized. In other embodiments, text on a netpage may be clicked or gestured to initiate a search based on keywords indicated by the user.

Figure 2:
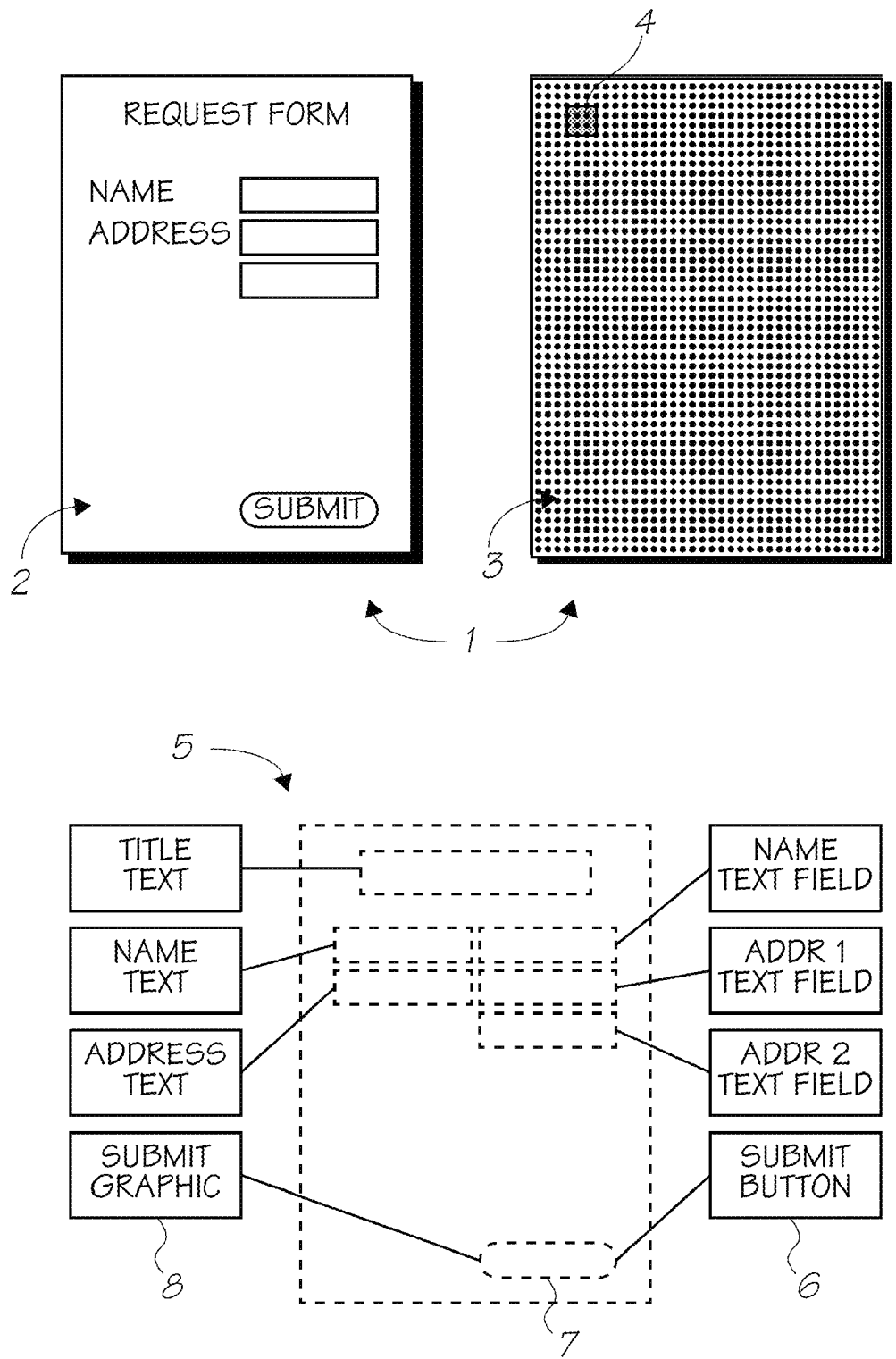
FIG. 2 is a schematic of a the relationship between a sample printed netpage and its online page description.

As illustrated in FIG. 2, a printed netpage 1 can represent an interactive form which can be filled in by the user both physically, on the printed page, and "electronically", via communication between the pen and the netpage system. The example shows a "Request" form containing name and address fields and a submit button. The netpage 1 consists of graphic data 2, printed using visible ink, and a surface coding pattern 3 superimposed with the graphic data. The surface coding pattern 3 comprises a collection of tags 4. One such tag 4 is shown in the shaded region of FIG. 2, although it will be appreciated that contiguous tags 4, defined by the coding pattern 3, are densely tiled over the whole netpage 1.

The corresponding page description 5, stored on the netpage network, describes the individual elements of the netpage. In particular it describes the type and spatial extent (zone) of each interactive element (i.e. text field or button in the example), to allow the netpage system to correctly interpret input via the netpage. The submit button 6, for example, has a zone 7 which corresponds to the spatial extent of the corresponding graphic 8.

As illustrated in FIG. 2, a netpage sensing device 400, such as the pen described in Section 3, works in conjunction with a netpage relay device 601, which is an Internet-connected device for home, office or mobile use. The pen 400 is wireless and communicates securely with the netpage relay device 601 via a short-range radio link 9. In an alternative embodiment, the netpage pen 400 utilises a wired connection, such as a USB or other serial connection, to the relay device 601.

The relay device 601 performs the basic function of relaying interaction data to a page server 10, which interprets the interaction data. As shown in FIG. 2, the relay device 601 may, for example, take the form of a personal computer 601a, a netpage printer 601b or some other relay 601c (e.g. personal computer or mobile phone incorporating a web browser).

The netpage printer 601b is able to deliver, periodically or on demand, personalized newspapers, magazines, catalogs, brochures and other publications, all printed at high quality as interactive netpages. Unlike a personal computer, the netpage printer is an appliance which can be, for example, wall-mounted adjacent to an area where the morning news is first consumed, such as in a user's kitchen, near a breakfast table, or near the household's point of departure for the day. It also comes in tabletop, desktop, portable and miniature versions. Netpages printed on-demand at their point of consumption combine the ease-of-use of paper with the timeliness and interactivity of an interactive medium.

Alternatively, the netpage relay device 601 may be a portable device, such as a mobile phone or PDA, a laptop or desktop computer, or an information appliance connected to a shared display, such as a TV. If the relay device 601 is not a netpage printer 601b which prints netpages digitally and on demand, the netpages may be printed by traditional analog printing presses, using such techniques as offset lithography, flexography, screen printing, relief printing and rotogravure, as well as by digital printing presses, using techniques such as drop-on-demand inkjet, continuous inkjet, dye transfer, and laser printing.

As shown in FIG. 2, the netpage sensing device 400 interacts with a portion of the tag pattern on a printed netpage 1, or other printed substrate such as a label of a product item 251, and communicates, via a short-range radio link 9, the interaction to the relay device 601. The relay 601 sends corresponding interaction data to the relevant netpage page server 10 for interpretation. Raw data received from the sensing device 400 may be relayed directly to the page server 10 as interaction data. Alternatively, the interaction data may be encoded in the form of an interaction URI and transmitted to the page server 10 via a user's web browser 601c. The web browser 601c may then receive a URI from the page server 10 and access a webpage via a webserver 201. In some circumstances, the page server 10 may access application computer software running on a netpage application server 13.

The netpage relay device 601 can be configured to support any number of sensing devices, and a sensing device can work with any number of netpage relays. In the preferred implementation, each netpage sensing device 400 has a unique identifier. This allows each user to maintain a distinct profile with respect to a netpage page server 10 or application server 13.

Digital, on-demand delivery of netpages 1 may be performed by the netpage printer 601b, which exploits the growing availability of broadband Internet access. Netpage publication servers 14 on the netpage network are configured to deliver print-quality publications to netpage printers. Periodical publications are delivered automatically to subscribing netpage printers via pointcasting and multicasting Internet protocols. Personalized publications are filtered and formatted according to individual user profiles.

A netpage pen may be registered with a netpage registration server 11 and linked to one or more payment card accounts. This allows e-commerce payments to be securely authorized using the netpage pen. The netpage registration server compares the signature captured by the netpage pen with a previously registered signature, allowing it to authenticate the user's identity to an e-commerce server. Other biometrics can also be used to verify identity. One version of the netpage pen includes fingerprint scanning, verified in a similar way by the netpage registration server.

1.2 Netpages

Netpages are the foundation on which a netpage network is built. They provide a paper-based user interface to published information and interactive services.

As shown in FIG. 2, a netpage consists of a printed page (or other surface region) invisibly tagged with references to an online description 5 of the page. The online page description 5 is maintained persistently by the netpage page server 10. The page description describes the visible layout and content of the page, including text, graphics and images. It also describes the input elements on the page, including buttons, hyperlinks, and input fields. A netpage allows markings made with a netpage pen on its surface to be simultaneously captured and processed by the netpage system.

Multiple netpages (for example, those printed by analog printing presses) can share the same page description. However, to allow input through otherwise identical pages to be distinguished, each netpage may be assigned a unique page identifier. This page ID has sufficient precision to distinguish between a very large number of netpages.

Each reference to the page description 5 is repeatedly encoded in the netpage pattern. Each tag (and/or a collection of contiguous tags) identifies the unique page on which it appears, and thereby indirectly identifies the page description 5. Each tag also identifies its own position on the page. Characteristics of the tags are described in more detail below.

Tags are typically printed in infrared-absorptive ink on any substrate which is infrared-reflective, such as ordinary paper, or in infrared fluorescing ink. Near-infrared wavelengths are invisible to the human eye but are easily sensed by a solid-state image sensor with an appropriate filter.

A tag is sensed by a 2D area image sensor in the netpage sensing device, and the tag data is transmitted to the netpage system via the nearest netpage relay device 601. The pen 400 is wireless and communicates with the netpage relay device 601 via a short-range radio link. It is important that the pen recognize the page ID and position on every interaction with the page, since the interaction is stateless. Tags are error-correctably encoded to make them partially tolerant to surface damage.

The netpage page server 10 maintains a unique page instance for each unique printed netpage, allowing it to maintain a distinct set of user-supplied values for input fields in the page description 5 for each printed netpage 1.

2 Netpage Tags

2.1 Tag Data Content

Each tag 4 identifies an absolute location of that tag within a region of a substrate.

Each interaction with a netpage should also provide a region identity together with the tag location. In a preferred embodiment, the region to which a tag refers coincides with an entire page, and the region ID is therefore synonymous with the page ID of the page on which the tag appears. In other embodiments, the region to which a tag refers can be an arbitrary subregion of a page or other surface. For example, it can coincide with the zone of an interactive element, in which case the region ID can directly identify the interactive element.

As described in the Applicant's previous applications (e.g. U.S. Pat. No. 6,832,717), the region identity may be encoded discretely in each tag 4. The region identity may be encoded by a plurality of contiguous tags in such a way that every interaction with the substrate still identifies the region identity, even if a whole tag is not in the field of view of the sensing device.

Each tag 4 should preferably identify an orientation of the tag relative to the substrate on which the tag is printed. Orientation data read from a tag enables the rotation (yaw) of the pen 101 relative to the substrate to be determined A tag 4 may also encode one or more flags which relate to the region as a whole or to an individual tag. One or more flag bits may, for example, signal a sensing device to provide feedback indicative of a function associated with the immediate area of the tag, without the sensing device having to refer to a description of the region. A netpage pen may, for example, illuminate an "active area" LED when in the zone of a hyperlink.

A tag 4 may also encode a digital signature or a fragment thereof. Tags encoding (partial) digital signatures are useful in applications where it is required to verify a product's authenticity. Such applications are described in, for example, US Publication No. 2007/0108285, the contents of which is herein incorporated by reference. The digital signature may be encoded in such a way that it can be retrieved from every interaction with the substrate. Alternatively, the digital signature may be encoded in such a way that it can be assembled from a random or partial scan of the substrate.

It will, of course, be appreciated that other types of information (e.g. tag size etc) may also be encoded into each tag or a plurality of tags.

2.2 General Tag Structure

Figure 3:
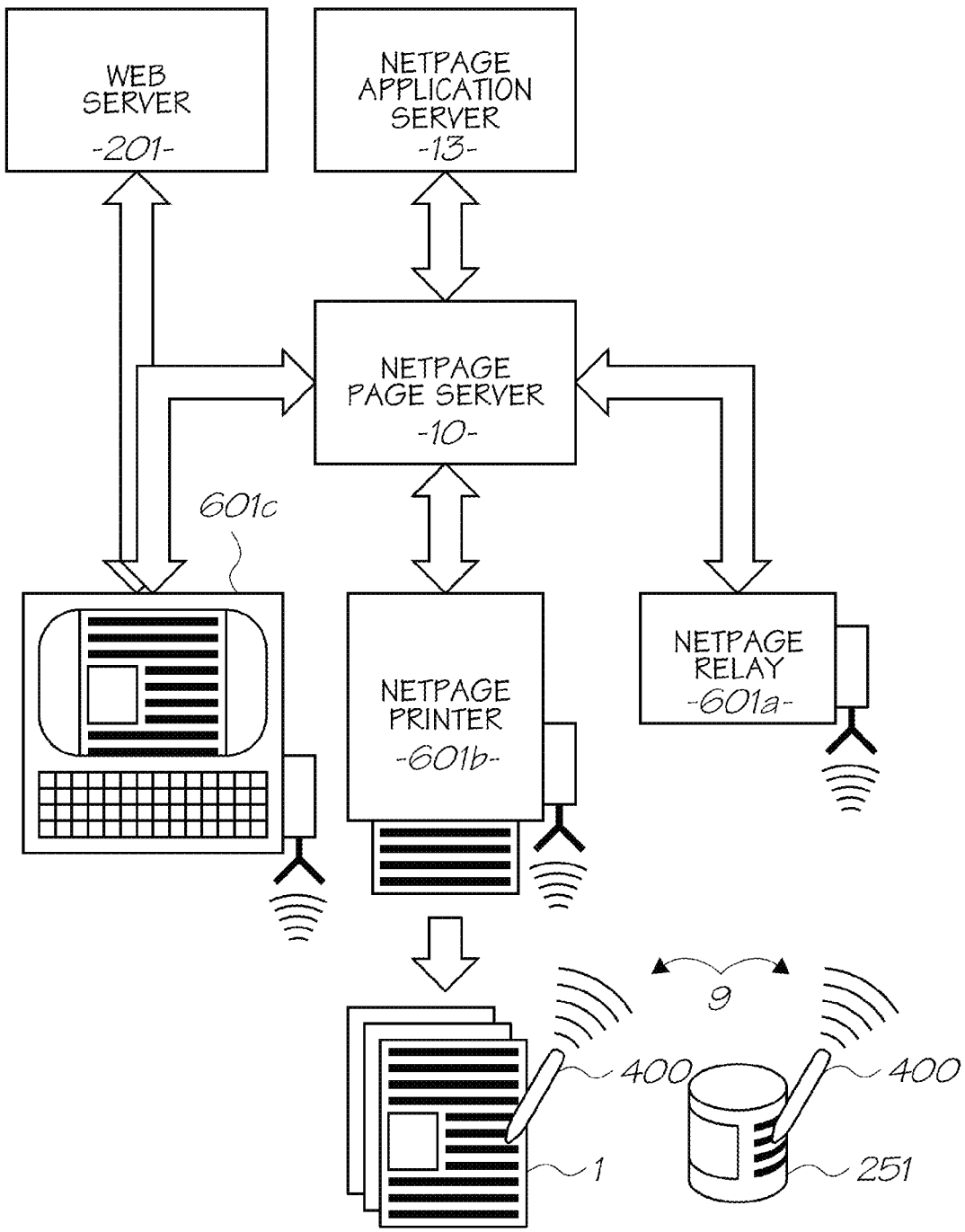
FIG. 3 shows an embodiment of basic netpage architecture with various alternatives for the relay device.
Figure 4:
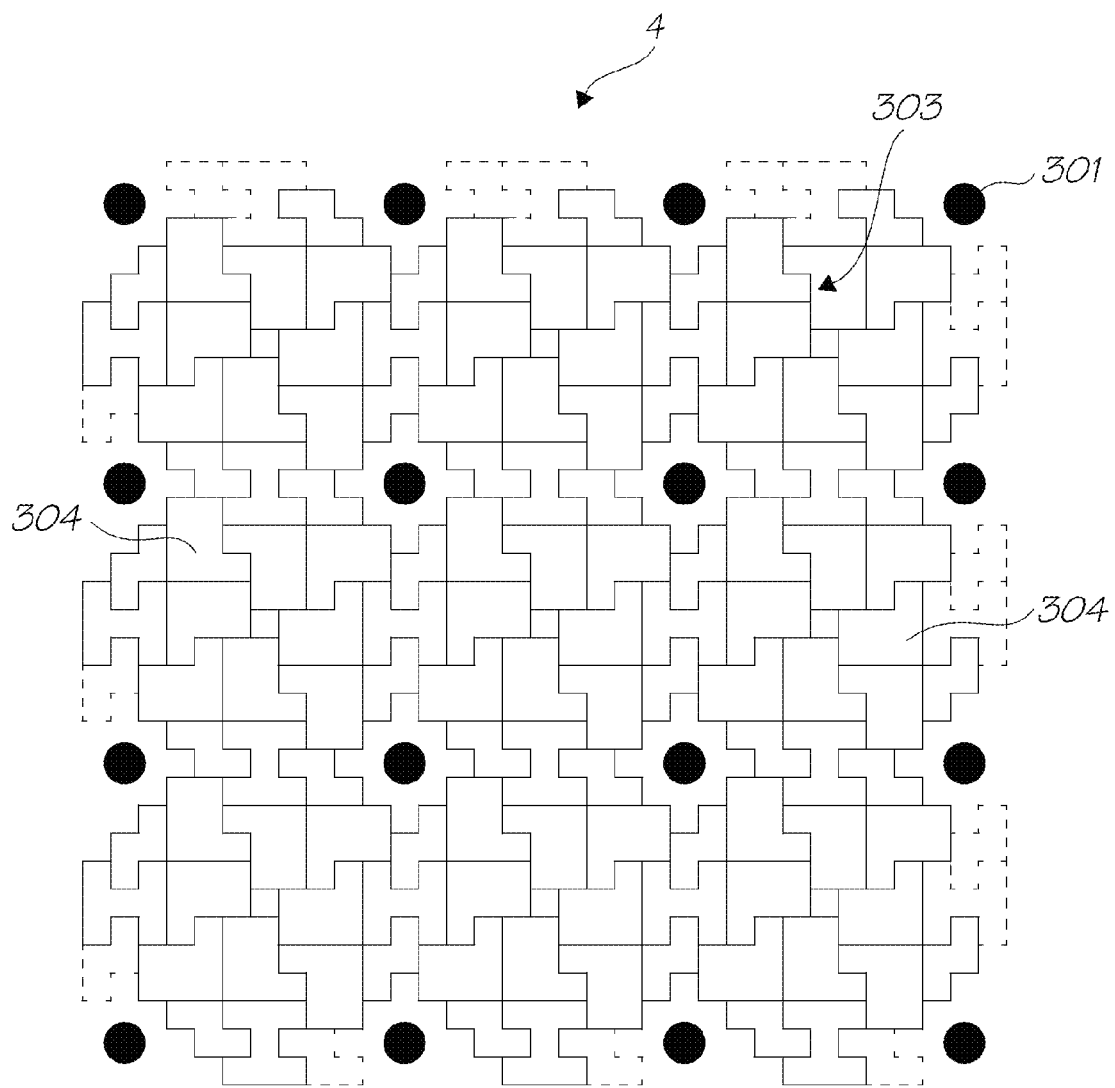
FIG. 4 shows the structure of a tag.

As described above in connection with FIG. 2, the netpage surface coding generally consists of a dense planar tiling of tags. In the present invention, each tag 4 is defined by a coding pattern which contains two kinds of elements. Referring to FIGS. 3 and 4, the first kind of element is a target element. Target elements in the form of target dots 301 allow a tag 4 to be located in an image of a coded surface, and allow the perspective distortion of the tag to be inferred. The second kind of element is a data element in the form of a dot or macrodot 302 (see FIG. 7). Collections of the macrodots 302 encode data values. As described in the Applicant's earlier disclosures (e.g. U.S. Pat. No. 6,832,717), the presence or absence of a macrodot was be used to represent a binary bit. However, the tag structure of the present invention encodes a data value using multi-pulse position modulation, which is described in more detail in Section 2.3.

The coding pattern 3 is represented on the surface in such a way as to allow it to be acquired by an optical imaging system, and in particular by an optical system with a narrow-band response in the near-infrared. The pattern 3 is typically printed onto the surface using a narrowband near-infrared ink.

FIG. 3 shows the structure of a complete tag 4 with target elements 301 shown. The tag 4 is square and contains sixteen target elements. Those target elements 301 located at the edges and corners of the tag (twelve in total) are shared by adjacent tags and define the perimeter of the tag. The high number of target elements 301 advantageously facilitates accurate determination of a perspective distortion of the tag 4 when it is imaged by the sensing device 101. This improves the accuracy of tag sensing and, ultimately, position determination.

The tag 4 consists of a square array of nine symbol groups 303. Symbol groups 303 are demarcated by the target elements 301 so that each symbol group is contained within a square defined by four target elements. Adjacent symbol groups 303 are contiguous and share targets.

Since the target elements 301 are all identical, they do not demarcate one tag from its adjacent tags. Viewed purely at the level of target elements, only symbol groups 303, which define grid cells of a target grid, can be distinguished—the tags 4 themselves are indistinguishable by viewing only the target elements 301. Hence, tags 4 must be aligned with the target grid as part of tag decoding.

The tag 4 is designed to allow all tag data to be recovered from an imaging field of view substantially the size of the tag. This implies that any data unique to the tag 4 must appear four times within the tag—i.e. once in each quadrant or quarter; any data unique to a column or row of tags must appear twice within the tag—i.e. once in each horizontal half or vertical half of the tag respectively; and any data common to a set of tags needs to appear once within the tag.

2.3 Symbol Groups

As shown in FIG. 4, each of the nine symbol groups 303 contains ten data symbols 304, each data symbol being part of a codeword. In addition, each symbol group 303 comprises four registration symbols. These allow the orientation and translation of the tag in the field of view to be determined, as well as the tag format to be determined Translation refers to the translation of tag(s) relative to the symbol groups 303 in the field of view. In other words, the registration symbols enable alignment of the 'invisible' tags with the target grid.

Each data symbol 304 is a multi-pulse position modulated (PPM) data symbol. Each PPM data symbol 304 encodes a single 4-bit or 5-bit Reed-Solomon symbol using 2 or 3 macrodots in any of 7 positions $\{p_0, p_1, p_2, p_3, p_4, p_5, p_6\}$, i.e. using 2-7 or 3-7 pulse-position modulation (PPM). 2-7 PPM is used if the tag format is 0; 3-7 PPM is used if the tag format is 1. 3-7 PPM has a range of 35 symbol values enabling 5-bit encoding with 3 unused symbol values, while 2-7 PPM has a range of 21 values enabling 4-bit encoding with 5 unused symbol values.

Figure 5:
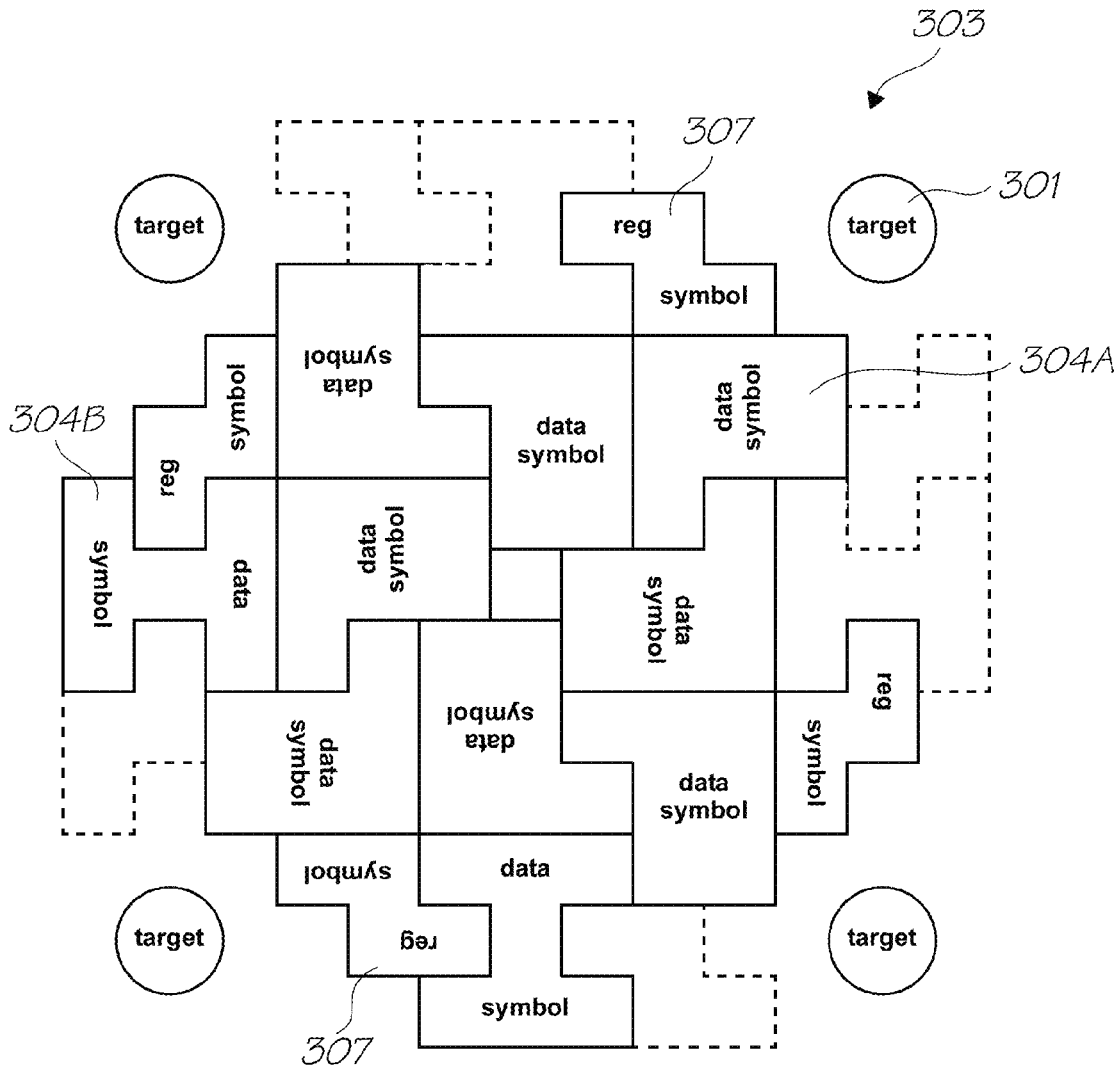
FIG. 5 shows a symbol group.

FIG. 5 shows the layout for a first 7 PPM data symbol 304A, which is substantially L-shaped.

Figure 6:
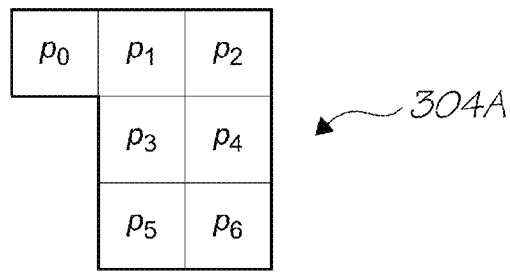
FIG. 6 shows the layout of a first 7 PPM data symbol.

FIG. 6 shows the layout for a second 7 PPM data symbol 304B, which is substantially H-shaped. The differently shaped 7 PPM data symbols 304A and 304B allow optimal tessellation of the data symbols when they interlock to form the coding pattern 3.

Table 1 defines the mapping from 2-7 PPM symbol values to Reed-Solomon data symbol values. Unused symbol values may be treated as erasures.

TABLE 1

2-7PPM symbol to 4-bit data symbol value mapping

| 2-7PPM symbol value ($p_6$-$p_0$) | 4-bit data symbol value (base 16) |
|---|---|
| 0,000,011 | unused |
| 0,000,101 | 0 |
| 0,000,110 | unused |
| 0,001,010 | 1 |
| 0,001,010 | 2 |
| 0,001,100 | 3 |
| 0,010,001 | 4 |
| 0,010,010 | 5 |
| 0,010,100 | unused |
| 0,011,000 | 6 |
| 0,100,001 | 7 |
| 0,100,010 | 8 |
| 0,100,100 | 9 |
| 0,101,000 | a |
| 0,110,000 | b |
| 1,000,001 | c |
| 1,000,010 | d |
| 1,000,100 | e |
| 1,001,000 | f |
| 1,010,000 | unused |
| 1,100,000 | unused |

Unused PPM symbol values are chosen to avoid macrodot pairs along the convex edge of the first L-shaped 7 PPM data symbol 304A shown in FIG. 5, in order to avoid clustering or clumping of macrodots 302 between adjacent data symbols. Thus, the ($p_0$, $p_1$), ($p_1$, $p_2$), ($p_2$, $p_4$), ($p_4$, $p_6$) and ($p_5$, $p_6$) doublets are unused in 2-7 PPM encoding because these doublets are positioned along the convex edge of the first data symbol 304A. With the tessellated tiling of data symbols 304 in the coding pattern, this non-arbitrary use of unused symbol values helps to minimize visibility of the coding pattern by maintaining a more even distribution of macrodots.

Table 2 defines the mapping from 3-7 PPM symbol values to data symbol values. Unused symbol values may be treated as erasures

TABLE 2

3-7PPM symbol to 5-bit data symbol value mapping

| 3-7PPM symbol value ($p_6$-$p_0$) | 5-bit data symbol value (base 16) |
|---|---|
| 0,000,111 | 0 |
| 0,001,011 | unused |
| 0,001,101 | 1 |
| 0,001,110 | 2 |
| 0,010,011 | 3 |
| 0,010,101 | 4 |
| 0,010,110 | unused |
| 0,011,001 | 5 |
| 0,011,010 | 6 |

TABLE 2-continued 3-7PPM symbol to 5-bit data symbol value mapping

| 3-7PPM symbol value ($p_6$-$p_0$) | 5-bit data symbol value (base 16) |
|---|---|
| 0,011,100 | 7 |
| 0,100,011 | 8 |
| 0,100,101 | 9 |
| 0,100,110 | a |
| 0,101,001 | b |
| 0,101,010 | c |
| 0,101,100 | d |
| 0,110,001 | e |
| 0,110,010 | f |
| 0,110,100 | 10 |
| 0,111,000 | 11 |
| 1,000,011 | 12 |
| 1,000,101 | 13 |
| 1,000,110 | 14 |
| 1,001,001 | 15 |
| 1,001,010 | 16 |
| 1,001,100 | 17 |
| 1,010,001 | 18 |
| 1,010,010 | 19 |
| 1,010,100 | 1a |
| 1,011,000 | 1b |
| 1,100,001 | 1c |
| 1,100,010 | 1d |
| 1,100,100 | 1e |
| 1,101,000 | 1f |
| 1,110,000 | unused |

Unused PPM symbol values are chosen to avoid macrodot triplets at the corners of the first 7 PPM data symbol 304A shown in FIG. 4, in order to avoid clustering or clumping of macrodots 302 between adjacent data symbols 304. Thus, the ($p_0$, $p_1$, $p_3$), ($p_1$, $p_2$, $p_4$) and ($p_4$, $p_5$, $p_6$) triplets are unused in 3-7 PPM encoding because these triplets are positioned at the corners of the first data symbol 304A. With the tessellated tiling of data symbols 304 in the coding pattern, this non-arbitrary use of unused symbol values helps to minimize visibility of the coding pattern by maintaining a more even distribution of macrodots.

2.4 Targets and Macrodots

Figure 7:
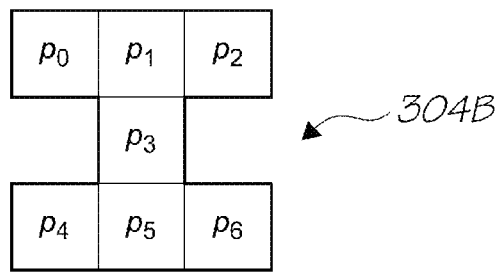
FIG. 7 shows the layout of a second 7 PPM data symbol.
Figure 8:
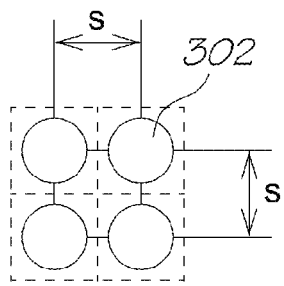
FIG. 8 shows the spacing of macrodot positions.

The spacing of macrodots 302 in both dimensions, as shown in FIG. 7, is specified by the parameter s. It has a nominal value of 127 μm, based on 8 dots printed at a pitch of 1600 dots per inch.

Only the macrodots 302 are part of the representation of a data symbol 304 in the coding pattern. The outline of a symbol 304 is shown in, for example, FIGS. 3 and 4 merely to elucidate more clearly the structure of a tag 4.

A macrodot 302 is nominally round with a nominal size of (⅝)s. However, it is allowed to vary in size by ±10% according to the capabilities of the device used to produce the pattern.

A target 301 is nominally circular with a nominal diameter of (12/8)s. However, it is allowed to vary in size by ±10% according to the capabilities of the device used to produce the pattern.

Each tag 4 has a width of 30 s and a length of 30 s. However, it should be noted from FIG. 3 that the tag 4 is configured so that some data symbols extend beyond the perimeter edge of the tag 4 and interlock with complementary symbol groups from adjacent tags. This arrangement provides a tessellated pattern of data symbols 304 within the coding pattern 3.

The macrodot spacing, and therefore the overall scale of the tag pattern, is allowed to vary by 120 μm and 127 μm according to the capabilities of the device used to produce the pattern. Any deviation from the nominal scale is recorded in each tag (via a macrodot size ID field) to allow accurate generation of position samples.

These tolerances are independent of one another. They may be refined with reference to particular printer characteristics.

2.5 Field of View

As mentioned above, the tag 4 is designed to allow all tag data to be recovered from an imaging field of view roughly the size of the tag. Any data common to a set of contiguous tags only needs to appear once within each tag, since fragments of the common data can be recovered from adjacent tags. Any data common only to a column or row of tags may appear twice within the tag—i.e. once in each horizontal half or vertical half of the tag respectively. Any data unique to the tag must appear four times within the tag—i.e. once in each quadrant.

Although data which is common to a set of tags, in one or both spatial dimensions, may be decoded from fragments from adjacent tags, pulse-position modulated values are best decoded from spatially-coherent samples (i.e. from a whole symbol as opposed to partial symbols at opposite sides of the field of view), since this allows raw sample values to be compared without first being normalised. This implies that the field of view must be large enough to contain two complete copies of each such pulse-position modulated value.

The tag is designed so that the maximum extent of a pulse-position modulated value is three macrodots (see FIG. 3). Thus, the minimum imaging field of view required to guarantee acquisition of an entire tag has a diameter of 46.7 s (i.e. $(30+3)\sqrt{2}$ s), allowing for arbitrary rotation and translation of the surface coding in the field of view. This field of view has a diameter of one tag plus one data symbol. This extra data symbol ensures that PPM data symbols can be decoded from contiguous macrodots.

Given a maximum macrodot spacing of 127 μm, the minimum required field of view has a diameter of 5.93 mm.

2.6 Encoded Codes and Codewords

In this following section (Section 2.6), each symbol in FIGS. 8 to 12 is shown with a unique label. The label consists of an alphabetic prefix which identifies which codeword the symbol is part of, and a numeric suffix which indicates the index of the symbol within the codeword. The orientation of each symbol label indicates the orientation of the corresponding symbol layout and is consistent with the symbol orientations shown in FIG. 4.

2.6.1 Designing an Optimized Registration Code

As discussed above, each tag 4 contains an array of square symbol groups 303, with each symbol group being demarcated by a set of target elements 301. In the present coding pattern 3 (known as "Cassia"), each tag 4 contains an array of 3×3 symbol groups with each symbol group being demarcated by four target elements. However, it will be appreciated that other configurations are of course possible e.g. 2×2, 4×4 etc.

The physical layout of the surface coding pattern consists of target elements which define 'grid cells' of a target grid. Each grid cell of the target grid, when viewed purely at the level of target elements and macrodot regions, may be described as a 'physical symbol group'. The physical layout of the coding pattern is designed so that it belongs to a plane symmetry group that has rotational symmetry of the same order as the number of targets delineating its physical symbol groups i.e. four-fold rotational symmetry. The physical layout also has translational symmetry with the physical symbol group as its unit cell. The present coding pattern has a physical layout which belongs to symmetry group p4m. However, 4-fold rotational symmetry is not an essential requirement of coding patterns utilizing the present registration encoding. In alternative coding patterns, the physical layout may be 2-fold, 3-fold or 6-fold rotationally symmetric. Examples of such physical layouts are described in U.S. Pat. No. 7,111,791, the contents of which is herein incorporated by reference.

Figure 13:
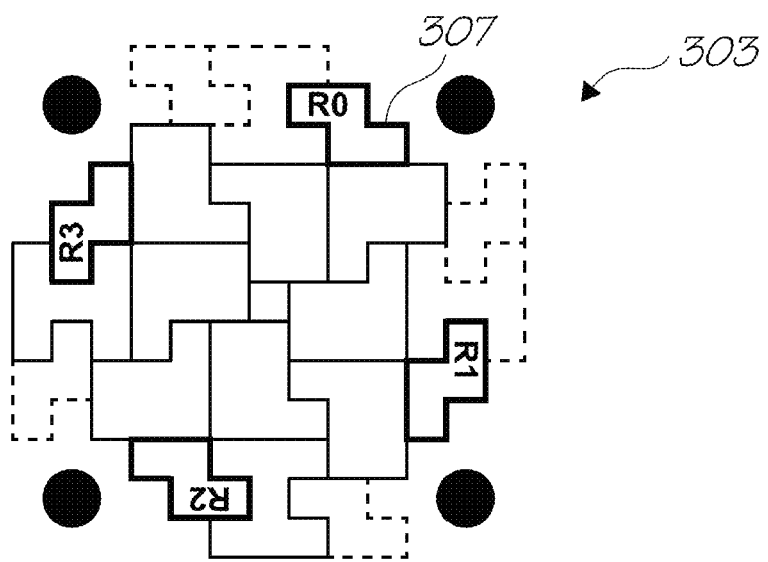
FIG. 13 shows the layout of registration symbols within a symbol group.

However, the logical layout of a surface coding pattern (i.e. consisting of arrangements of data symbols and codewords—see FIG. 13) no longer has the same four-fold rotational symmetry as the physical layout. Rather, the logical layout is designed so that it belongs to a plane symmetry group that has translational symmetry with the tag, rather than the symbol group, as its unit cell. The logical layout of the present coding pattern has the tag as its unit cell and a logical layout which belongs to symmetry group p1.

During decoding, the physical layout (i.e. the layout of 4-fold rotationally symmetric cells) is directly discernable from the physical pattern of the targets 301. However, the rotation and translation of the logical layout with respect to the physical layout must be determined by the decoding process.

Assuming t targets per physical symbol group and c physical symbol groups per tag, there are ct possible transformations (or registrations) between a physical layout and a logical layout. Thus, the present coding pattern has 4×3×3=36 possible registrations.

The Netpage surface coding includes a registration code that allows the registration between the physical layout and the logical layout to be determined The physical layout of the registration code has the same symmetry as the physical layout of the surface coding itself, while the logical layout of the registration code has the same symmetry as the logical layout of the surface coding. Crucially, however, the registration code is designed so that a valid codeword of the registration code can be read according to just the physical layout of the registration code, i.e. with an arbitrary registration, and this codeword will uniquely indicate the actual registration.

In the present coding pattern, the registration code contains one registration symbol per target within a symbol group, i.e. t registration symbols per symbol group and therefore ct registration symbols per tag. Hence, the present coding pattern contains 36 registration symbols. However, the number of registration symbols within each symbol group may be any integer multiple n of the rotational symmetry. For example, in the 4-fold rotationally symmetric symbol groups described herein, each symbol group may contain 4, 8, 12, 16 etc registration symbols positioned in a 4-fold rotationally symmetric arrangement.

In addition to registration, it may be convenient to encode other information in the registration code. For example, if a surface coding supports multiple levels of redundancy and/or multiple modulation schemes for its data content, then the registration code can be used to encode the format of the tag data. It is also convenient to encode an active area flag that indicates whether a particular tag is part of an active area on the surface.

Since a surface coding is designed to be decodable from an imaging field of view (FOV) just large enough to contain a single tag, a decoder generally utilizes fragments from adjacent tags. While the tag format is common to an entire surface region, the active area flag varies by tag. The active area flag is therefore more difficult to encode effectively in a registration code.

When the registration code has sufficient capacity it is convenient to encode registration, format and flag using a structured scheme that is easy to decode. In the structured scheme, each symbol group contains a registration code which independently identifies the registration, format and flag. However, when the registration code does not have sufficient capacity for a structured scheme it is convenient to use an unstructured scheme that can be optimized for the available capacity. The present invention employs an unstructured code, which has the advantage of minimizing the data capacity of registration symbols.

The capacity of a registration code is a function of both its length and the capacity of its symbols. Since its length is proportional to the number of registrations it must encode, the capacity of its symbols determines its effective capacity.

Using d-in-p multi-pulse position modulation, the capacity C of a symbol is:

$$C=p!/(p-d)!d!$$

Thus, registration symbols using 2-5 PPM have a capacity of 10 values, while reduced capacity registration symbols according to the present invention using 2-4 PPM have a capacity of 6 values (see Table 3 in Section 2.6.2).

An unstructured registration code is optimal in the sense that its error-correcting capacity is maximal. Its error-correcting capacity is higher than that of a structured registration code, but at the expense of a more complex decoder. The decoder for a structured code typically consists of a set of minimum-distance decoders operating on shorter sub-codes within the code, while the decoder for an unstructured code typically consists of a single minimum-distance decoder operating on the entire code.

Figure 9:
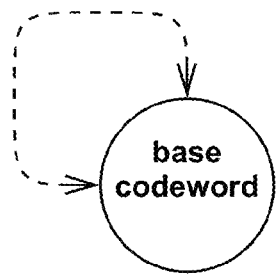
FIG. 9 shows inter-codeword minimum distances in a registration code that encodes just registration.

A registration code that encodes just registration consists of ct codewords, each of which corresponds to one of the possible transformations of a single base codeword, as illustrated in FIG. 9. (In FIG. 9, the dotted arrow indicates distances between different registrations of the base codeword, with all distances being equal or exceeding $d_{min}$).

An optimal registration code is obtained by maximising the minimum distance between its codewords.

No analytic method for obtaining an optimal registration code of a certain size and symbol capacity, nor even for determining its maximal minimum distance, is known to the present Applicant. The vector space of possible base codewords has a size of $C^{ct}$. For typical code sizes and symbol capacities this space is not amenable to exhaustive search. Useful registration codes can, however, be obtained by random search.

Figure 10:
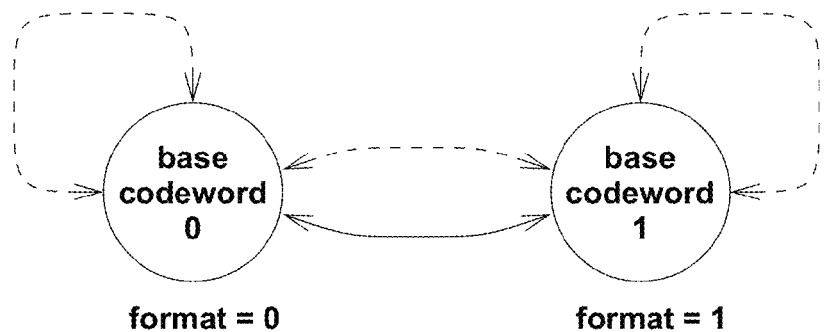
FIG. 10 shows inter-codeword minimum distances in a registration code that encodes registration and two tag format values.

A registration code that encodes both registration and f possible tag format values consists of ctf codewords, each of which corresponds to one of the ctf possible transformations of f base codewords, as illustrated in FIG. 10 (for f=2). (In FIG. 10, the dotted arrows indicate distances between different registrations of base codewords, with solid arrows indicating the distance between base codewords and all distances being equal or exceeding $d_{min}$).

An optimal format-encoding registration code is obtained by maximising the minimum distance between its codewords.

Figure 11:
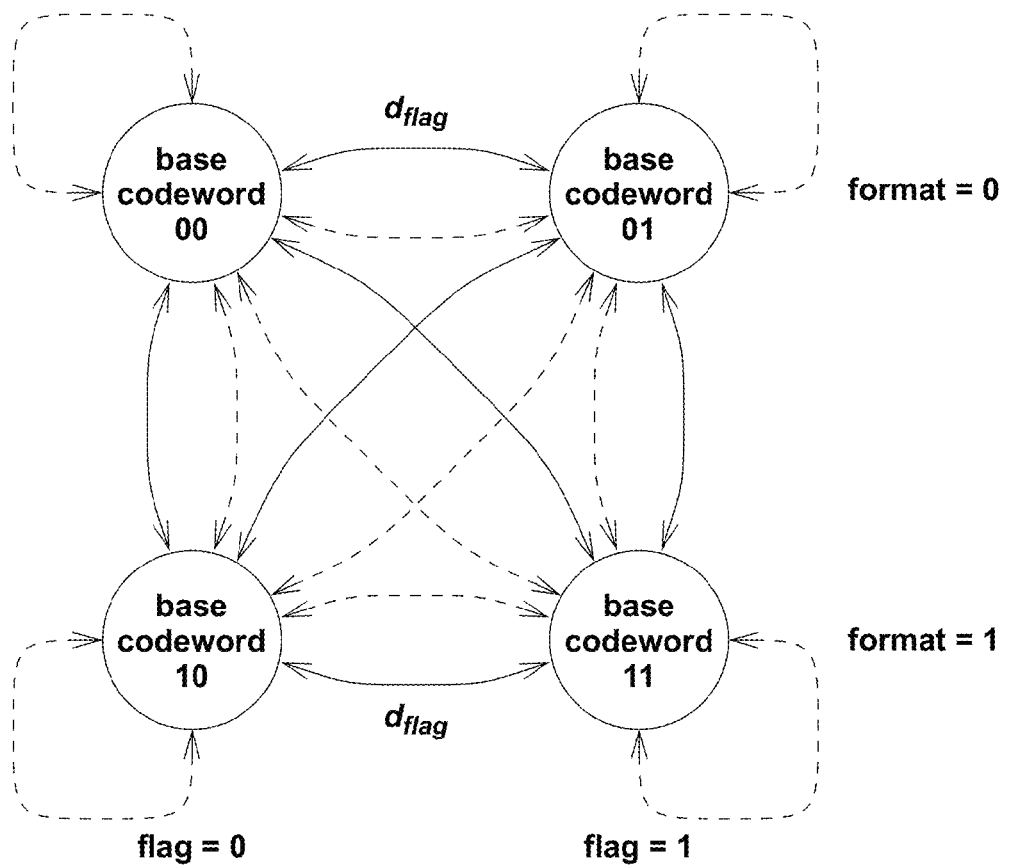
FIG. 11 shows inter-codeword minimum distances in a registration code that encodes registration, two tag format values and two flag values.

A registration code that encodes registration, f possible tag format values, and g possible flag values consists of ctfg codewords, each of which corresponds to one of the possible transformations of fg base codewords, as illustrated in FIG. 11 (for f=2 and g=2). (In FIG. 11, the dotted arrows indicate distances between different registrations of base codewords, with solid arrows indicating the distance between base codewords and all distances being equal or exceeding $d_{min}$).

Because the flag value varies by tag, an optimal flag-encoding registration code is no longer obtained simply by maximising the minimum distance between its codewords. Instead, because a decoder needs to be able to decode the registration code from fragments from adjacent tags, the registration code needs to be designed so that any variation in flag value between adjacent tags does not excessively undermine registration decoding by introducing apparent errors.

The impact of flag value variation on the robustness of registration decoding can be reduced, at the expense of the robustness of flag decoding, by selecting the base codewords so that the distance between base codewords representing the same format value but different flag values is shorter than the minimum distance otherwise. This relatively shorter distance between different flag base codewords is referred to as $d_{flag}$, and is labelled as such in FIG. 11. In all other cases the minimum distance is relatively longer.

In practice, relatively less robust flag decoding is usually not problematic. The flag is typically interpreted as a hint and can therefore safely be interpreted as set if its value is ambiguous.

The registration code may additionally allow a reflection of the logical layout relative to the physical layout to be determined The physical layout has at least one 2D reflection axis so that the physical layout is preserved in its mirror image, while the logical layout has no reflection axes. A modified registration code, which allows reflection to be determined, is useful if the coding pattern is imaged in reflection, e.g. reflected in a mirror or through the back of a transparent substrate.

With at least one reflection axis per physical symbol group, t targets per physical symbol group and c physical symbol groups per tag, there will be 2ct possible registrations between a physical layout and a logical layout. Therefore, in this modified registration code, there are 2×4×3×3=72 possible registrations.

Although the values of the 2-4 PPM registration symbols will be different depending on whether they are read from the front or back of the substrate (i.e. reflected or not), this can be readily taken into account when the code is optimized so as to maximally separate its codewords. Accordingly, the differences in registration symbol values is not an issue when reading the coding pattern from the front or back of the substrate.

2.6.2 Optimized Unstructured Registration Code

Figure 12:
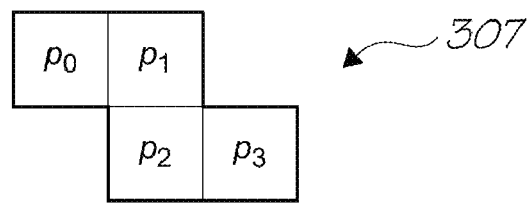
FIG. 12 shows the layout of a registration symbol.

Each symbol group comprises four registration symbols, nominally designated R0, R1, R2, and R3. Each registration symbol 307 is encoded using 2-4 PPM and so is limited to 6 symbol values. FIG. 12 shows the layout of one 4 PPM registration symbol 307

As shown in FIG. 5 and FIG. 13, the registration symbols 307 each appear four times within a symbol group.

Table 3 defines the mapping from 2-4 PPM symbol values to registration symbol values. Unused symbol values are treated as erasures.

TABLE 3

2-4PPM symbol to registration symbol mapping

| 2-4PPM symbol value ($p_3$-$p_0$) | registration symbol value |
|---|---|
| 0011 | 0 |
| 0101 | 1 |
| 0110 | 2 |
| 1001 | 3 |
| 1010 | 4 |
| 1100 | 5 |

The registration code is defined by four base codewords, each with 36 variants corresponding to the 36 possible registrations between a symbol group 303 and a tag 4. The registration code therefore includes 144 codewords. (Each of the four base codewords would have 72 variants if the registration code allowed reflections to be determined, as described in Section 2.6.1.)

A tag 4 contains a single base registration codeword consisting of 4 registration symbols in each symbol group, i.e. 36 registration symbols in all, as shown in FIG. 5 and FIG. 13.

The registration codeword of a tag encodes the orientation, translation, format and active area flag of the tag. Table 4 defines the four base registration codewords, each of which encodes one of the four combinations of tag format and active area flag.

TABLE 4

Base registration codewords

| codeword | tag format | active area flag |
|---|---|---|
| 4414, 0332, 2253, 1132, 1411, 3402, 5503, 2113, 2155 | 0 | 0 |
| 2414, 3332, 4253, 4132, 4411, 5402, 4503, 1113, 3155 | 0 | 1 |
| 2321, 5555, 1101, 1212, 5500, 4540, 5531, 4311, 4512 | 1 | 0 |
| 0321, 3555, 0101, 0212, 4500, 5540, 1531, 5311, 5512 | 1 | 1 |

Each base codeword encodes zero rotation and translation, i.e. it is only when a base codeword is read at a non-zero rotation and/or translation that the resulting variant of the base codeword encodes the corresponding non-zero rotation and/or translation.

A base codeword is assigned to the registration symbols of a tag starting with the left-most symbol of the codeword being assigned to R0 of the top left symbol group of a tag, and then proceeding left-to-right within the codeword and columnwise to the right and row-wise down in the symbol group array of the tag.

The registration code is designed so that it has a minimum distance of 26, with the exception of pairs of codewords that encode the same registration and tag format but different active area flags. The distance within these pairs ($d_{flag}$) is 9. This ensures that local variations in the value of the active area flag do not destroy the error-correcting capacity of the registration code.

A registration codeword is decoded using a minimum distance decoder. In the absence of active area flag variation the registration code has the capacity to correct 12 errors. In the presence of active area flag variation it has a worst-case capacity to correct 8 errors.

2.6.3 Coordinate Data

The tag contains an x-coordinate codeword and a y-coordinate codeword used to encode the x and y coordinates of the tag respectively. The codewords are of a shortened $2^4$-ary or $2^5$-ary (15, 3) Reed-Solomon code. The tag therefore encodes either two 12-bit or two 15-bit coordinates. A $2^4$-ary code is used if the tag format is 0; a $2^5$-ary code is used if the tag format is 1.

The x coordinate codeword is constant within the column of tags containing the tag, while the y coordinate codeword is constant within the row of tags containing the tag.

The symbols of the coordinate codewords are evenly distributed throughout the tag. This distribution ensures that an image of the tag pattern large enough to contain a complete tag is guaranteed to contain at least 9 symbols of each coordinate codeword, irrespective of the alignment of the image with the tag pattern. Missing symbols must be treated as erasures. The (possibly punctured) instance of either coordinate codeword may consist of fragments from different tags. Note that symbols of the x coordinate codeword placed in a particular column of the tag are guaranteed to be acquired in their entirety from either the tag or its immediate neighbour to the left or right, since the field of view is at least one symbol larger than the tag (as discussed in Section 2.5). The same applies to symbols of the y coordinate codeword placed in a particular row of the tag.

The layout of the coordinate codewords is shown in FIG. 1. The codewords share the same layout, but are rotated 90 degrees relative to each other.

2.6.4 Common Data

The tag contains three codewords A, B, C and D which encode information common to a set of contiguous tags in a surface region. The codewords are of a $2^4$-ary or shortened $2^5$-ary (15, 7) Reed-Solomon code. The tag therefore encodes either 112 bits or 140 bits of information common to a set of contiguous tags. A $2^4$-ary code is used if the tag format is 0; a $2^5$-ary code is used if the tag format is 1.

The common codewords are replicated throughout a tagged region. This guarantees that an image of the tag pattern large enough to contain a complete tag is guaranteed to contain a complete instance of each common codeword, irrespective of the alignment of the image with the tag pattern. The instance of each common codeword may consist of fragments from different tags.

Figure 14:
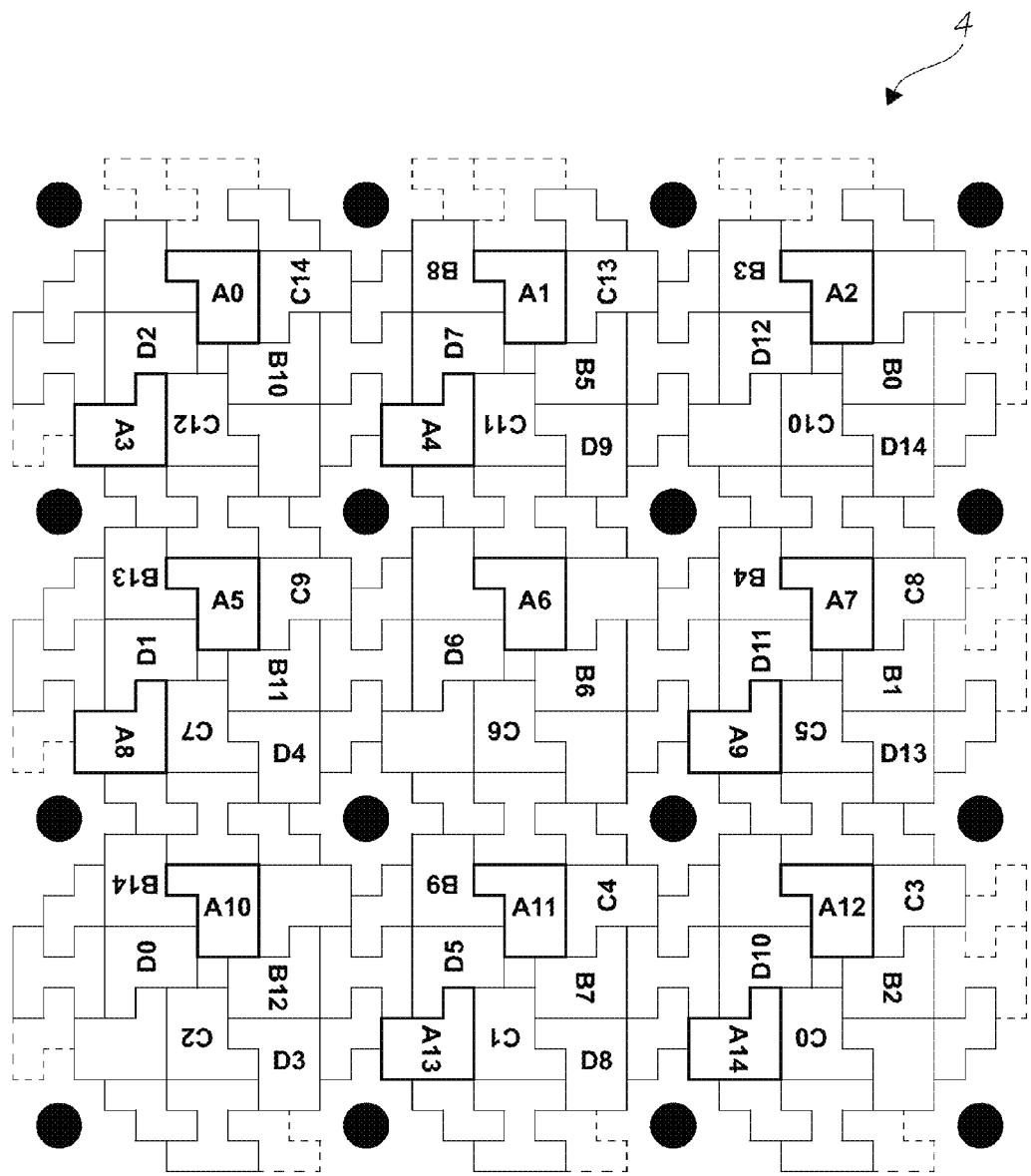
FIG. 14 shows the layout of common codewords A, B and C and D.

The layout of the common codewords is shown in FIG. 14. The codewords have the same layout, rotated 90 degrees relative to each other.

2.6.5 Complete Tag

Figure 15:
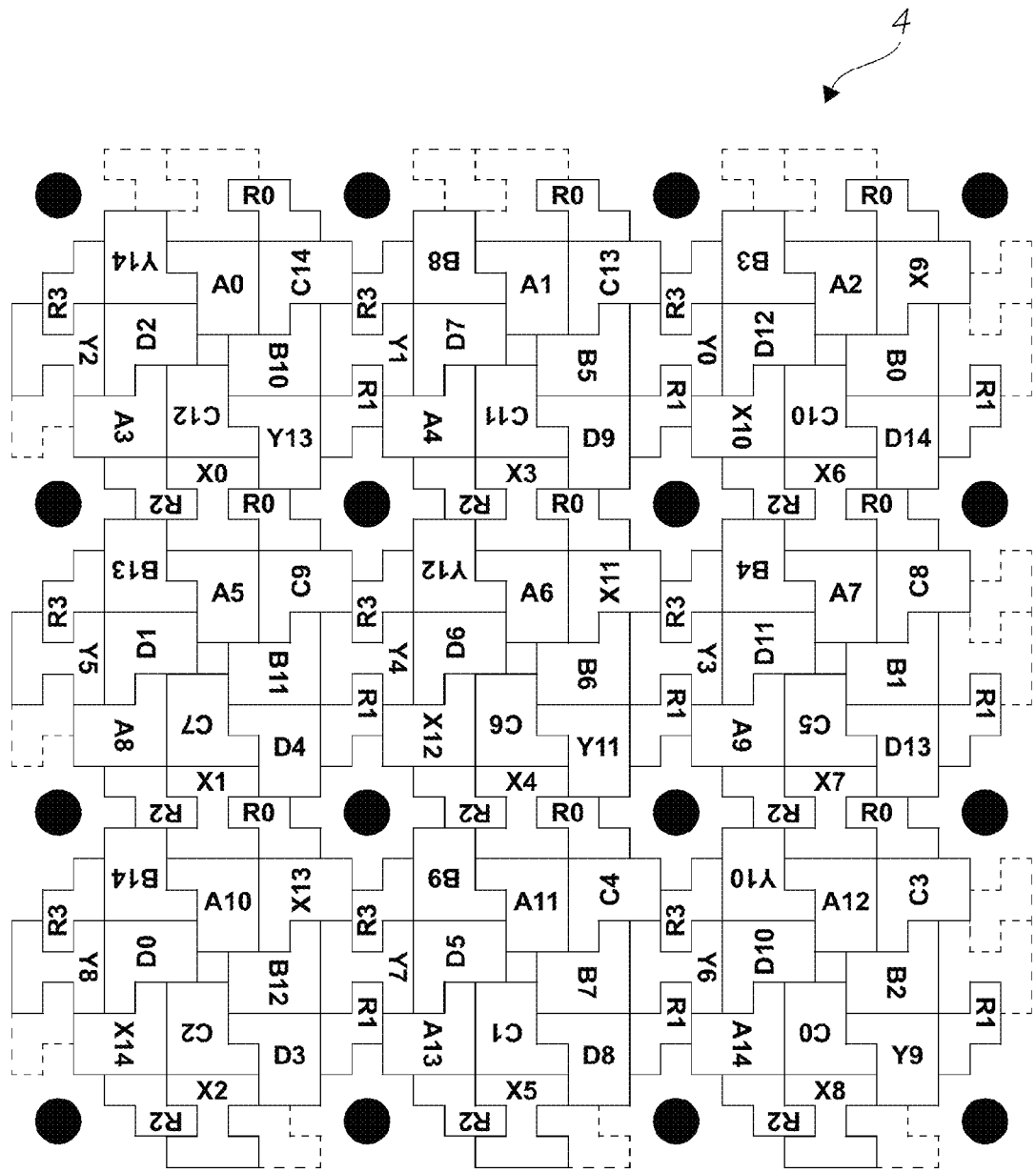
FIG. 15 shows the layout of a complete tag.

FIG. 15 shows the layout of the data of a complete tag, including data symbols and registration symbols.

2.7 Error Detection and Correction 2.7.1 Reed-Solomon Encoding

All data is encoded using a Reed-Solomon code defined over $GF(2^m)$, where the degree m=4 when the tag format is 0, and m=5 when the tag format is 1.

The code has a natural length n of $2^m-1$. The dimension k of the code is chosen to balance the error correcting capacity and data capacity of the code, which are (n-k)/2 and k symbols respectively.

The code may be punctured, by removing high-order redundancy symbols, to obtain a code with reduced length and reduced error correcting capacity. The code may also be shortened, by replacing high-order data symbols with zeros, to obtain a code with reduced length and reduced data capacity. Both puncturing and shortening can be used to obtain a code with particular parameters. Shortening is preferred, where possible, since this avoids the need for erasure decoding.

The code has the following primitive polynominals:

$p(x)=x^4+x+1$, when m=4

$p(x)=x^5+x^2+1$, when m=5

The code has the following generator polynominal:

$$g(x) = \prod_{i=1}^{n-k}(x+\alpha^i)$$

For a detailed description of Reed-Solomon codes, refer to Wicker, S. B. and V. K. Bhargava, eds., *Reed-Solomon Codes and Their Applications*, IEEE Press, 1994.

2.7.2 Codeword Organization

Figure 16:
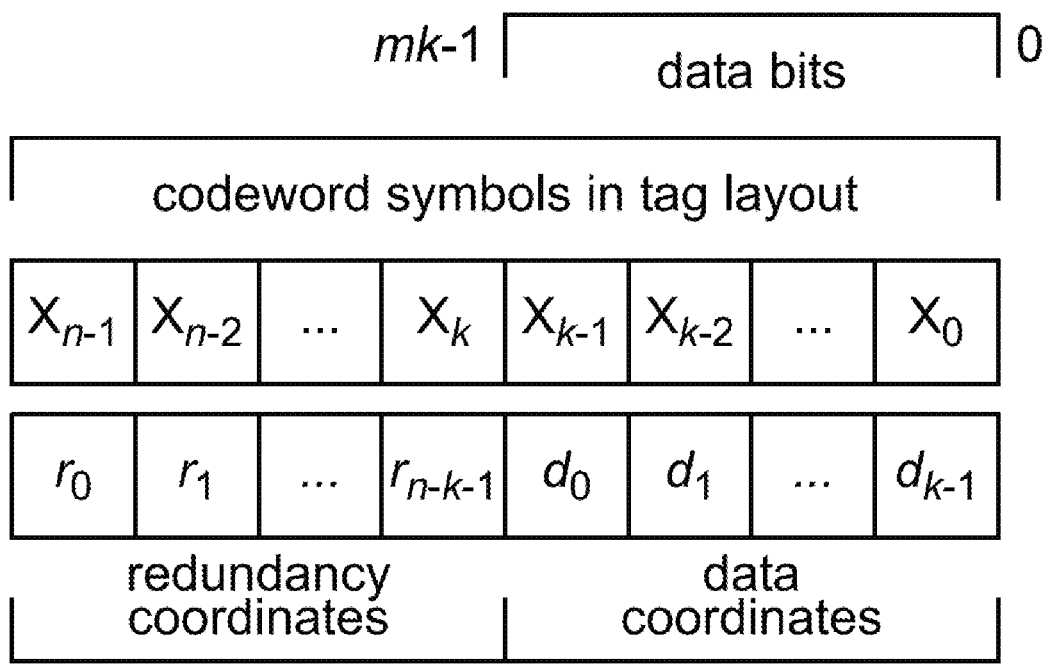
FIG. 16 shows the layout of a Reed-Solomon codeword.

As shown in FIG. 16, redundancy coordinates $r_i$ and data coordinates $d_i$ of the code are indexed from left to right according to the power of their corresponding polynomial terms. The symbols $X_i$ of a complete codeword are indexed from right to left to match the bit order of the data. The bit order within each symbol is the same as the overall bit order.

2.7.3 Code Instances

Table 5 defines the parameters of the different codes used in the tag.

TABLE 5

Codeword instances

| codeword name | codeword description | length (n) | dimension (k) | error-correcting capacity (symbols) | degree (m) | data capacity[a] (bits) |
|---|---|---|---|---|---|---|
| X, Y | coordinate codewords (see Section 2.6.3) | 9-15[a] | 3 | 3-6 | 4<br>5 | 12<br>15 |
| A, B, C, D | common codewords (see Section 2.6.4) | 15 | 7 | 4 | 4<br>5 | 28<br>35 |

[a]Effective codeword length depends on codeword visibility within field of view.

2.7.4 Cyclic Redundancy Check

The region ID encoded by the common codewords is protected by a 16-bit cyclic redundancy check (CRC). This provides an added layer of error detection after Reed-Solomon error correction, in case a codeword containing a part of the region ID is mis-corrected.

The CRC has the following generator polynomial:

$$g(x) = x^{16} + x^{12} + x^5 + 1$$

The CRC is initialised to 0xFFFF. The most significant bit of the region ID is treated as the most significant coefficient of the data polynomial.

2.8 Tag Coordinate Space

The tag coordinate space has two orthogonal axes labelled x and y respectively. When the positive x axis points to the right then the positive y axis points down.

The surface coding does not specify the location of the tag coordinate space origin on a particular tagged surface, nor the orientation of the tag coordinate space with respect to the surface. This information is application-specific. For example, if the tagged surface is a sheet of paper, then the application which prints the tags onto the paper may record the actual offset and orientation, and these can be used to normalise any digital ink subsequently captured in conjunction with the surface.

The position encoded in a tag is defined in units of tags and is defined to be the centre of the top left target. The origin of a particular tag pattern is therefore the centre of the top left target of the tag that encodes coordinate pair (0, 0).

The surface coding is optionally displaced from its nominal position relative to the surface by an amount derived from the region ID. This ensures that the utilisation of a pagewidth digital printhead used to print the surface coding is uniform. The displacement of the surface coding is negative, hence the displacement of the region described by the surface coding is positive relative to the surface coding. The magnitude of the displacement is the region ID modulo the width of the tag in 1600 dpi dots (i.e. 240). To accommodate non-1600 dpi printers the actual magnitude of the displacement may vary from its nominal value by up to half the dot pitch of the printer.

2.9 Tag Information Content
2.9.1 Field Definitions

Table 6 defines the information fields embedded in the surface coding.

TABLE 6

Field Definitions

| field | width (bits) | description |
|---|---|---|
| unique to tag | | |
| active area flag | 1 | A flag indicating whether the area[a] immediately surrounding a tag intersects an active area. |
| x coordinate | 12 or 15 | The unsigned x coordinate of the tag[b]. |
| y coordinate | 12 or 15 | The unsigned y coordinate of the tag[b]. |
| common to tagged region | | |
| tag format | 1 | The format of the tag:<br>0: 2-7PPM, m = 4<br>1: 3-7PPM, m = 5 |
| encoding format | 2 | The format of the encoding.<br>0: the present encoding. Other values are reserved |
| region flags | 10 | Flags controlling the interpretation of region data (see Table 7). |
| macrodot size ID | 4 | The ID of the macrodot size. |
| region ID | 80 or 108 | The ID of the region containing the tags. |
| CRC (Cyclic Redundancy Check) | 16 | A CRC of the region ID (see Section 2.7.4). |

[a]the diameter of the area, centered on the tag, is nominally 2.5 times the diagonal size of the tag; this is to accommodate the worst-case distance between the nib position and the imaged tag
[b]allows a coordinate value ranges of 15 m and 118 km respectively for the minimum tag size of 3.6 mm (based on the minimum macrodot size of 120 microns and 30 macrodots per tag)

An active area is an area within which any captured input should be immediately forwarded to the corresponding Netpage server 10 for interpretation. This also allows the Netpage server 10 to signal to the user that the input has had an immediate effect. Since the server has access to precise region definitions, any active area indication in the surface coding can be imprecise so long as it is inclusive.

TABLE 7

Region flags

| bit | meaning |
| --- | --- |
| 0 | Region is interactive, i.e. x and y-coordinates are present. |
| 1 | Region is active, i.e. the entire region is an active area. Otherwise active areas are identified by individual tags' active area flags. |
| 2 | Region ID is serialized[a]. |
| 3 | Region ID contains a digital signature[b] |
| 4 | Region ID is an EPC |
| 5 | Region is displaced according to region ID (see Section 2.8) |
| other | Reserved for future use |

[a]If not set for an EPC this means that the serial number is replaced by a layout number, to allow the package design associated with a product to vary over time (see US 2007/0108285, the contents of which is herein incorporated by reference).
[b]Hence the region ID should not be transmitted in the clear during resolution.

2.9.2 Mapping of Fields to Codewords

Table 8 and Table 9 define how the information fields map to codewords.

TABLE 8

Mapping of fields to coordinate codewords X and Y

| codeword | field | tag format | field width | field bits | codeword bits |
| --- | --- | --- | --- | --- | --- |
| X | x coordinate | 0 | 12 | all | all |
|   |   | 1 | 15 |   |   |
| Y | y coordinate | 0 | 12 | all | all |
|   |   | 1 | 15 |   |   |

TABLE 9

Mapping of fields to common codewords A, B, C and D

| codeword | field | tag format | field width | field bits | codeword bits |
| --- | --- | --- | --- | --- | --- |
| A | CRC | any | 16 | all | 15:0 |
|   | region ID | 0 | 12 | 11:0 | 27:16 |
|   |   | 1 | 19 | 18:0 | 34:16 |
| B | encoding format | any | 2 | all | 1:0 |
|   | region flags | any | 10 | all | 11:2 |
|   | macrodot size ID | any | 4 | all | 15:12 |
|   | region ID | 0 | 12 | 23:12 | 27:16 |
|   |   | 1 | 19 | 37:19 | 34:16 |
| C | region ID | 0 | 28 | 51:24 | all |
|   |   | 1 | 35 | 72:38 | all |
| D | region ID | 0 | 28 | 79:52 | all |
|   |   | 1 | 35 | 107:73 | all |

When the region flags indicate that a particular codeword is absent then the codeword is not coded in the tag pattern, i.e. there are no macrodots representing the codeword. This applies to the X and Y i.e. the X and Y codewords are present if the <region is interactive> flag in the region flags is set.

2.10 Tag Imaging and Decoding

As explained above, the minimum imaging field of view required to guarantee acquisition of data from an entire tag has a diameter of 47.6 s (i.e. $(30+3)\sqrt{2}$ s), allowing for arbitrary rotation and translation of the surface coding in the field of view. Notably, the imaging field of view does not have to be large enough to guarantee capture of an entire tag—the arrangement of the data symbols within each tag ensures that a any square portion of length (l+3 s) captures the requisite information in full, irrespective of whether a whole tag is actually visible in the field-of-view. As used herein, l is defined as the length of a tag.

The extra three macrodot units ensure that pulse-position modulated values can be decoded from spatially coherent samples. Furthermore, the extra three macrodot units ensure that all requisite data symbols can be read with each interaction. These include the coordinate symbols from a central column or row of a tag (see Section 2.6.3) having a width of 3 s.

In the present context, a "tag diameter" is given to mean the length of a tag diagonal.

Figure 17:
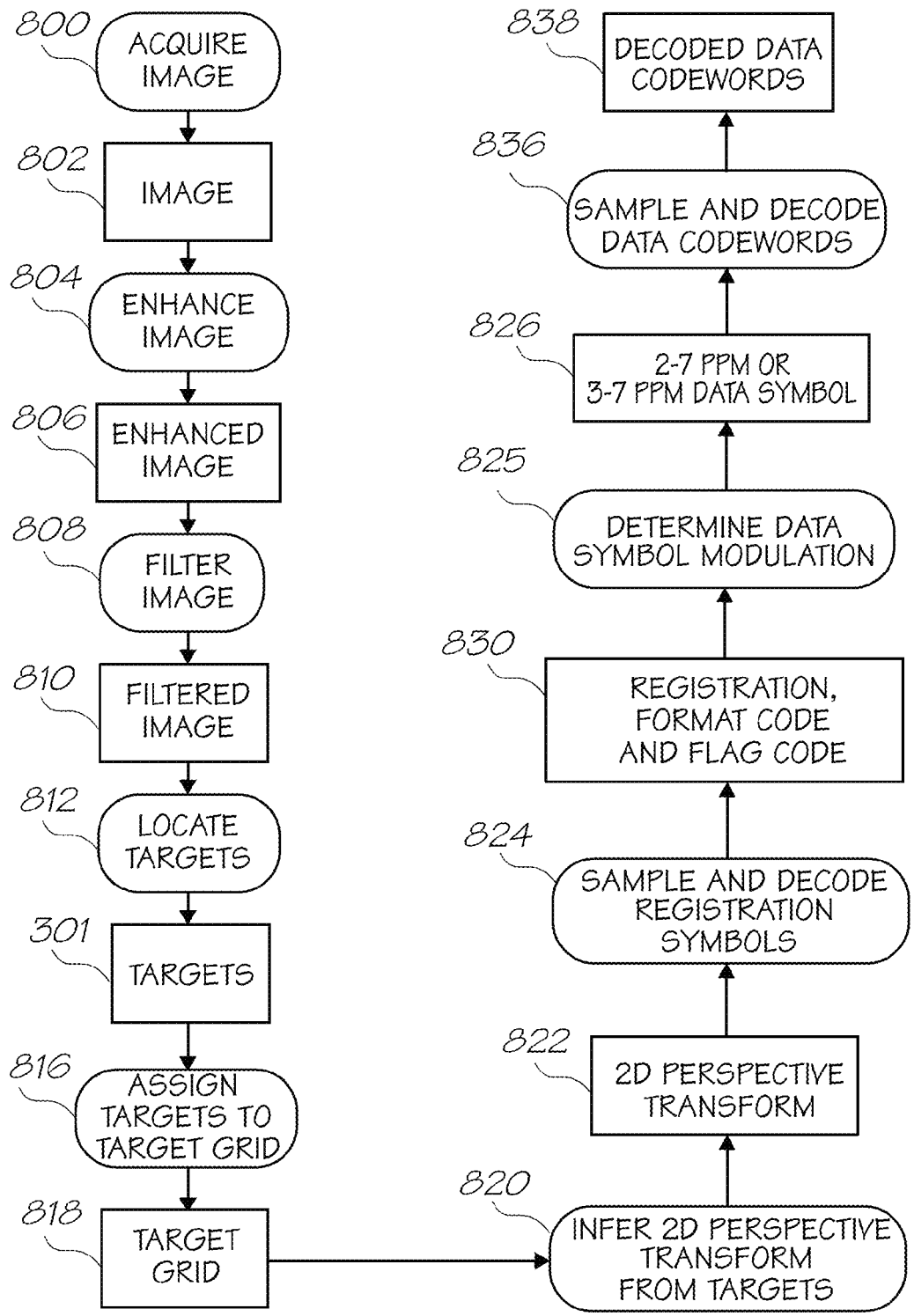
FIG. 17 is a flowchart of image processing.

FIG. 17 shows a tag image processing and decoding process flow up to the stage of sampling and decoding the data codewords. Firstly, a raw image 802 of the tag pattern is acquired (at 800), for example via an image sensor such as a CCD image sensor, CMOS image sensor, or a scanning laser and photodiode image sensor. The raw image 802 is then typically enhanced (at 804) to produce an enhanced image 806 with improved contrast and more uniform pixel intensities. Image enhancement may include global or local range expansion, equalisation, and the like. The enhanced image 806 is then typically filtered (at 808) to produce a filtered image 810. Image filtering may consist of low-pass filtering, with the low-pass filter kernel size tuned to obscure macrodots 302 but to preserve targets 301. The filtering step 808 may include additional filtering (such as edge detection) to enhance target features 301. Encoding of data codewords 304 using pulse position modulation (PPM) provides a more uniform coding pattern 3 than simple binary dot encoding (as described in, for example, U.S. Pat. No. 6,832,717). Advantageously, this helps separate targets 301 from data areas, thereby allowing more effective low-pass filtering of the PPM-encoded data compared to binary-coded data.

Following low-pass filtering, the filtered image 810 is then processed (at 812) to locate the targets 301. This may consist of a search for target features whose spatial inter-relationship is consistent with the known geometry of the tag pattern. Candidate targets may be identified directly from maxima in the filtered image 810, or may be the subject of further characterization and matching, such as via their (binary or grayscale) shape moments (typically computed from pixels in the enhanced image 806 based on local maxima in the filtered image 810), as described in U.S. Pat. No. 7,055,739, the contents of which is herein incorporated by reference.

The identified targets 301 are then assigned (at 816) to a target grid 818. At this stage, individual tags 4 will not be identifiable in the target grid 818, because the targets 301 do not demarcate one tag from another.

To allow macrodot values to be sampled accurately, the perspective transform of the captured image must be inferred. Four of the targets 301 are taken to be the perspective-distorted corners of a square of known size in tag space, and the eight-degree-of-freedom perspective transform 822 is inferred (at 820), based on solving the well-understood equations relating the four tag-space and image-space point pairs. Calculation of the 2D perspective transform is described in detail in, for example, Applicant's U.S. Pat. No. 6,832,717, the contents of which is herein incorporated by reference.

The inferred tag-space to image-space perspective transform 822 is used to project each known macrodot position in tag space into image space. Since all bits in the tags are represented by PPM-encoding, the presence or absence of each macrodot 302 can be determined using a local intensity reference, rather than a separate intensity reference. Thus, PPM-encoding provides improved data sampling compared with pure binary encoding.

At the next stage, at least 36 registration symbols visible within the field of view are sampled and decoded (at 824). Decoding of the 36 registration symbols enables to the pen to construct a sampled registration codeword consisting of 36 registration symbol values arranged in a sequence determined by reading each registration symbol within the field of view in a predetermined order.

The sampled registration codeword is identified as a variant of one of the four base registration codewords defined in Table 4. As discussed above in Section 2.6.2, identification of one of the four base registration codewords enables the tag format code (0 or 1) and flag code (0 or 1) to be determined (at 830). Moreover, the particular variant of the base registration codeword corresponding to the sampled registration codeword enables the registration (i.e. the vertical translation, horizontal translation and orientation) to be determined (at 830).

The horizontal and vertical translations (identified from the sampled registration codeword) are used to determine the translation of tags(s) (or portions thereof) in the field of view relative to the target grid 818. This enables alignment of the tags 4 with the target grid 818, thereby allowing individual tag(s), or portions thereof, to be distinguished in the coding pattern 3 in the field of view. Usually, a whole tag will not be visible in the field of view although it is, of course, possible for a whole tag to be visible when the field of view is aligned with the coding pattern at zero horizontal and vertical translations.

The orientation (identified from the sampled registration codeword) is used to determine the orientation of the data symbols relative to the target grid 818.

The flag code is used to identify the presence of absence of an active area flag in the tag (or part thereof) within the field of view.

The tag format code is used to determine (at 825) the data symbol modulation. The tag format codes of 0 and 1 identify 2-7 PPM and 3-7 PPM encoding of data symbols, respectively (at 826). The type of PPM encoding needs to be known before decoding of the data symbols (at 836).

Once initial imaging and decoding has yielded the 2D perspective transform, the orientation, the translation of tag(s) relative to the target grid and the format of the data symbols, the data codewords 304 can then be sampled and decoded (at 836) to yield the requisite decoded codewords 838.

Decoding of the data codewords 304 typically proceeds as follows:
  sample and decode Reed-Solomon codeword containing common data (A, B, C and D)
  verify CRC of common data
  on decode error flag bad region ID sample
  determine region ID
  sample and decode x and y coordinate Reed-Solomon codewords (X and Y)
  determine tag x-y location from codewords
  determine nib x-y location from tag x-y location and perspective transform taking into account macrodot size (from macrodot size ID)
  determine active area status of nib location with reference to active area flag identified from registration codeword
  encode region ID, nib x-y location, and nib active area status in digital ink ("interaction data")

In practice, when decoding a sequence of images of a tag pattern, it is useful to exploit inter-frame coherence to obtain greater effective redundancy.

Region ID decoding need not occur at the same rate as position decoding.

The skilled person will appreciate that the decoding sequence described above represents one embodiment of the present invention. It will, of course, be appreciated that the digital ink ("interaction data") sent from the pen 101 to the netpage system in the form of digital ink may include other data e.g. a digital signature, pen mode (see US 2007/125860), orientation data, pen ID, nib ID etc.

An example of interpreting digital ink, received by the netpage system from the netpage pen 101, is discussed briefly above. A more detailed discussion of how the netpage system may interpret interaction data can be found in the Applicant's previously-filed applications (see, for example, US 2007/130117 and US 2007/108285, the contents of which are herein incorporated by reference).

3. Netpage Pen 3.1 Functional Overview

The active sensing device of the netpage system may take the form of a clicker (for clicking on a specific position on a surface), a pointer having a stylus (for pointing or gesturing on a surface using pointer strokes), or a pen having a marking nib (for marking a surface with ink when pointing, gesturing or writing on the surface). For a description of various netpage sensing devices, reference is made to U.S. Pat. No. 7,105,753; U.S. Pat. No. 7,015,901; U.S. Pat. No. 7,091,960; and US Publication No. 2006/0028459, the contents of each of which are herein incorporated by reference.

It will be appreciated that the present invention may utilize any suitable optical reader. However, the Netpage pen 400 will be described herein as one such example.

The Netpage pen 400 is a motion-sensing writing instrument which works in conjunction with a tagged Netpage surface (see Section 2). The pen incorporates a conventional ballpoint pen cartridge for marking the surface, an image sensor and processor for simultaneously capturing the absolute path of the pen on the surface and identifying the surface, a force sensor for simultaneously measuring the force exerted on the nib, and a real-time clock for simultaneously measuring the passage of time.

While in contact with a tagged surface, as indicated by the force sensor, the pen continuously images the surface region adjacent to the nib, and decodes the nearest tag in its field of view to determine both the identity of the surface, its own instantaneous position on the surface and the pose of the pen. The pen thus generates a stream of timestamped position samples relative to a particular surface, and transmits this stream to the Netpage server 10. The sample stream describes a series of strokes, and is conventionally referred to as digital ink (DInk). Each stroke is delimited by a pen down and a pen up event, as detected by the force sensor. More generally, any data resulting from an interaction with a Netpage, and transmitted to the Netpage server 10, is referred to herein as "interaction data".

The pen samples its position at a sufficiently high rate (nominally 100 Hz) to allow a Netpage server to accurately reproduce hand-drawn strokes, recognise handwritten text, and verify hand-written signatures.

The Netpage pen also supports hover mode in interactive applications. In hover mode the pen is not in contact with the paper and may be some small distance above the surface of the paper (or other substrate). This allows the position of the pen, including its height and pose to be reported. In the case of an interactive application the hover mode behaviour can be used to move a cursor without marking the paper, or the distance of the nib from the coded surface could be used for tool behaviour control, for example an air brush function.

The pen includes a Bluetooth radio transceiver for transmitting digital ink via a relay device to a Netpage server. When operating offline from a Netpage server the pen buffers captured digital ink in non-volatile memory. When operating online to a Netpage server the pen transmits digital ink in real time.

The pen is supplied with a docking cradle or "pod". The pod contains a Bluetooth to USB relay. The pod is connected via a USB cable to a computer which provides communications support for local applications and access to Netpage services.

The pen is powered by a rechargeable battery. The battery is not accessible to or replaceable by the user. Power to charge the pen can be taken from the USB connection or from an external power adapter through the pod. The pen also has a power and USB-compatible data socket to allow it to be externally connected and powered while in use.

The pen cap serves the dual purpose of protecting the nib and the imaging optics when the cap is fitted and signalling the pen to leave a power-preserving state when uncapped.

3.2 Ergonomics and Layout

Figure 18:
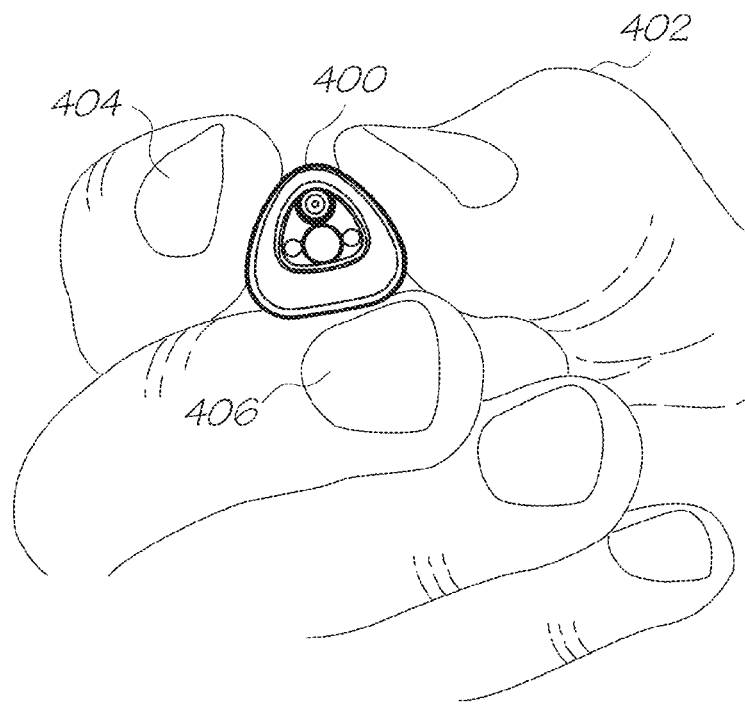
FIG. 18 shows a nib and elevation of the pen held by a user.

FIG. 18 shows a rounded triangular profile gives the pen 400 an ergonomically comfortable shape to grip and use the pen in the correct functional orientation. It is also a practical shape for accommodating the internal components. A normal pen-like grip naturally conforms to a triangular shape between thumb 402, index finger 404 and middle finger 406.

Figure 19:
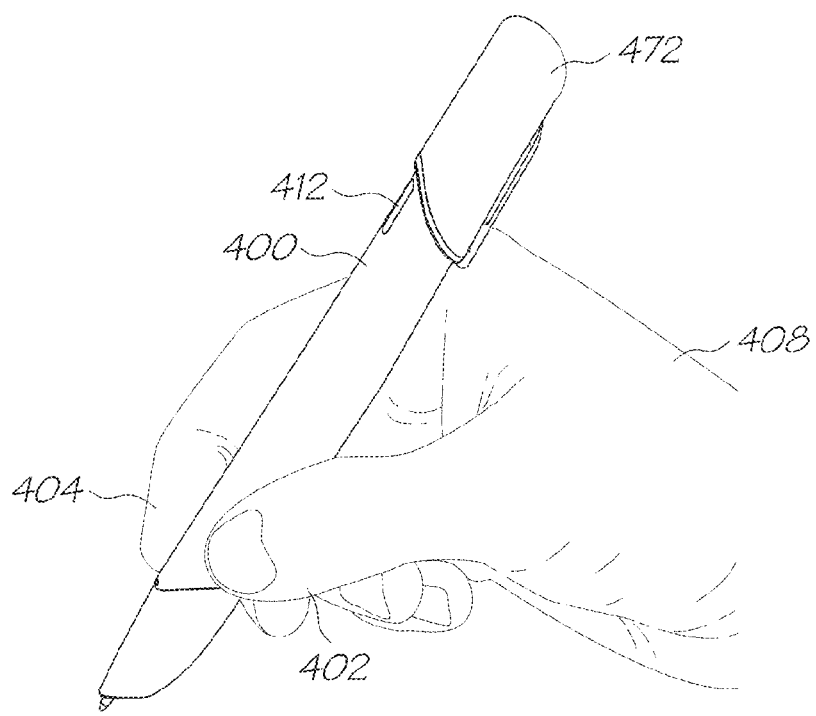
FIG. 19 shows the pen held by a user at a typical incline to a writing surface.

As shown in FIG. 19, a typical user writes with the pen 400 at a nominal pitch of about 30 degrees from the normal toward the hand 408 when held (positive angle) but seldom operates a pen at more than about 10 degrees of negative pitch (away from the hand). The range of pitch angles over which the pen 400 is able to image the pattern on the paper has been optimised for this asymmetric usage. The shape of the pen 400 helps to orient the pen correctly in the user's hand 408 and to discourage the user from using the pen "upside-down". The pen functions "upside-down" but the allowable tilt angle range is reduced.

The cap 410 is designed to fit over the top end of the pen 400, allowing it to be securely stowed while the pen is in use. Multi colour LEDs illuminate a status window 412 in the top edge (as in the apex of the rounded triangular cross section) of the pen 400 near its top end. The status window 412 remains un-obscured when the cap is stowed. A vibration motor is also included in the pen as a haptic feedback system (described in detail below).

Figure 20:
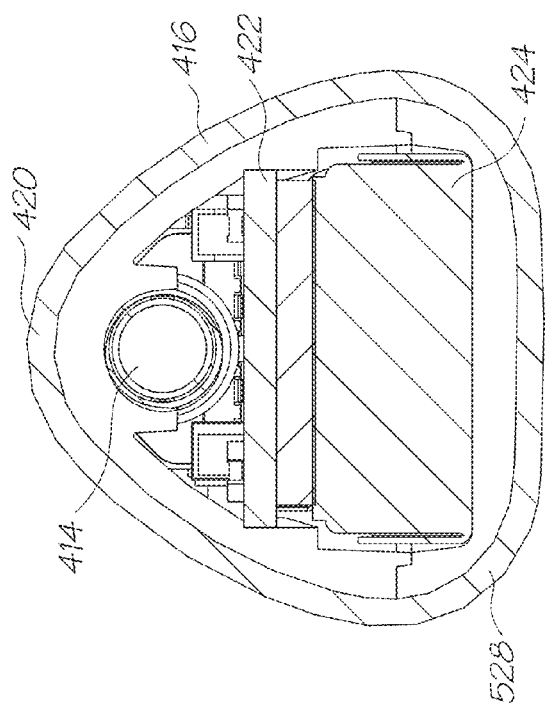
FIG. 20 is a lateral cross section through the pen.

As shown in FIG. 20, the grip portion of the pen has a hollow chassis molding 416 enclosed by a base molding 528 to house the other components. The ink cartridge 414 for the ball point nib (not shown) fits naturally into the apex 420 of the triangular cross section, placing it consistently with the user's grip. This in turn provides space for the main PCB 422 in the centre of the pen and for the battery 424 in the base of the pen. By referring to FIG. 21A, it can be seen that this also naturally places the tag-sensing optics 426 unobtrusively below the nib 418 (with respect to nominal pitch). The nib molding 428 of the pen 400 is swept back below the ink cartridge 414 to prevent contact between the nib molding 428 and the paper surface when the pen is operated at maximum pitch.

As best shown in FIG. 21B, the imaging field of view 430 emerges through a centrally positioned IR filter/window 432 below the nib 418, and two near-infrared illumination LEDs 434, 436 emerge from the two bottom corners of the nib molding 428. Each LED 434, 436 has a corresponding illumination field 438, 440.

As the pen is hand-held, it may be held at an angle that causes reflections from one of the LED's that are detrimental to the image sensor. By providing more than one LED, the LED causing the offending reflections can be extinguished.

Specific details of the pen mechanical design can be found in US Publication No. 2006/0028459, the contents of which are herein incorporated by reference.

3.3 Pen Feedback Indications

Figure 22:
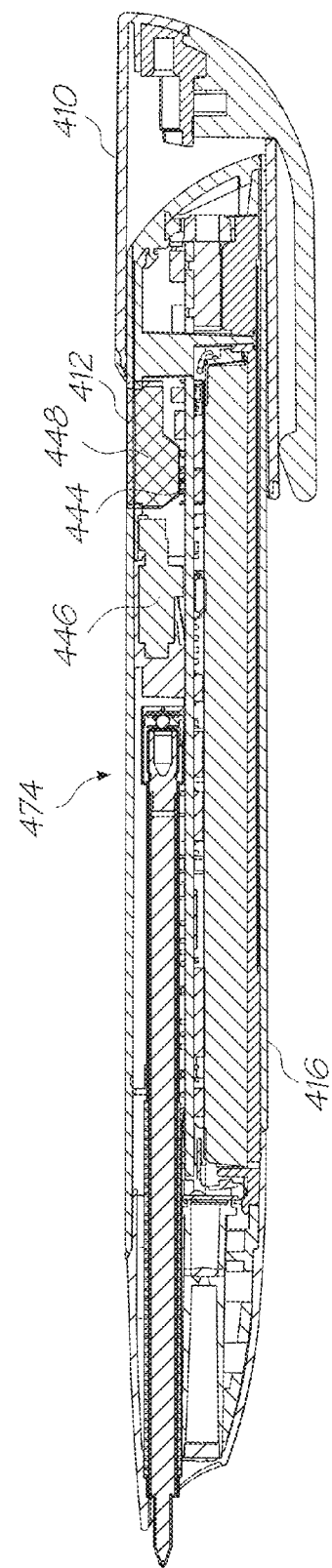
FIG. 22 is a longitudinal cross section of the pen.

FIG. 22 is a longitudinal cross section through the centre-line if the pen 400 (with the cap 410 stowed on the end of the pen). The pen incorporates red and green LEDs 444 to indicate several states, using colours and intensity modulation. A light pipe 448 on the LEDs 444 transmit the signal to the status indicator window 412 in the tube molding 416. These signal status information to the user including power-on, battery level, untransmitted digital ink, network connection on-line, fault or error with an action, detection of an "active area" flag, detection of an "embedded data" flag, further data sampling to required to acquire embedded data, acquisition of embedded data completed etc.

A vibration motor 446 is used to haptically convey information to the user for important verification functions during transactions. This system is used for important interactive indications that might be missed due to inattention to the LED indicators 444 or high levels of ambient light. The haptic system indicates to the user when:

The pen wakes from standby mode
There is an error with an action
To acknowledge a transaction

3.4 Pen Optics

The pen incorporates a fixed-focus narrowband infrared imaging system. It utilizes a camera with a short exposure time, small aperture, and bright synchronised illumination to capture sharp images unaffected by defocus blur or motion blur.

TABLE 10

| Optical Specifications | |
|---|---|
| Magnification | −0.225 |
| Focal length of lens | 6.0 mm |
| Viewing distance | 30.5 mm |
| Total track length | 41.0 mm |
| Aperture diameter | 0.8 mm |
| Depth of field | .⁻/6.5 mm |
| Exposure time | 200 us |
| Wavelength | 810 nm |
| Image sensor size | 140 × 140 pixels |
| Pixel size | 10 um |
| Pitch range | −15 to 45 deg |
| Roll range | −30 to 30 deg |
| Yaw range | 0 to 360 deg |
| Minimum sampling rate | 2.25 pixels per macrodot |
| Maximum pen velocity | 0.5 m/s |

[1] Allowing 70 micron blur radius
[2] Illumination and filter
[3] Pitch, roll and yaw are relative to the axis of the pen Cross sections showing the pen optics are provided in FIGS. 23A and 23B. An image of the Netpage tags printed on a surface 548 adjacent to the nib 418 is focused by a lens 488 onto the active region of an image sensor 490. A small aperture 494 ensures the available depth of field accommodates the required pitch and roll ranges of the pen 400.

First and second LEDs 434 and 436 brightly illuminate the surface 549 within the field of view 430. The spectral emission peak of the LEDs is matched to the spectral absorption peak of the infrared ink used to print Netpage tags to maximise contrast in captured images of tags. The brightness of the LEDs is matched to the small aperture size and short exposure time required to minimise defocus and motion blur.

A longpass IR filter 432 suppresses the response of the image sensor 490 to any coloured graphics or text spatially coincident with imaged tags and any ambient illumination below the cut-off wavelength of the filter 432. The transmission of the filter 432 is matched to the spectral absorption peak of the infrared ink to maximise contrast in captured images of tags. The filter also acts as a robust physical window, preventing contaminants from entering the optical assembly 470.

3.5 Pen Imaging System

Figure 24:
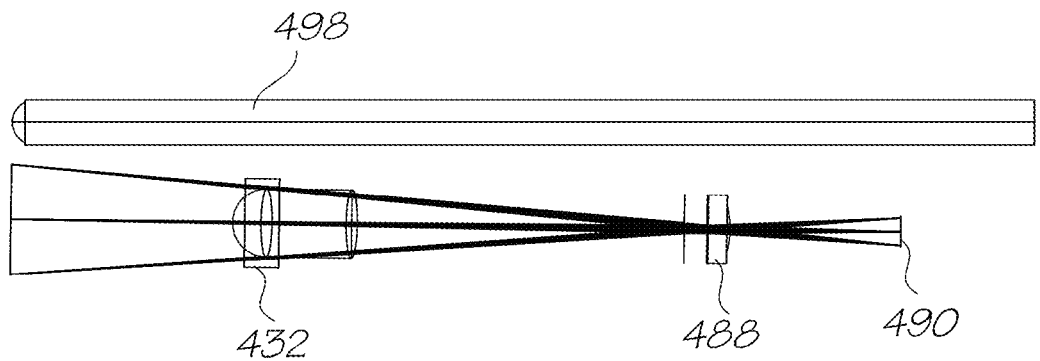
FIG. 24 is a ray trace of the pen optics adjacent a sketch of the ink cartridge.
Figure 25:
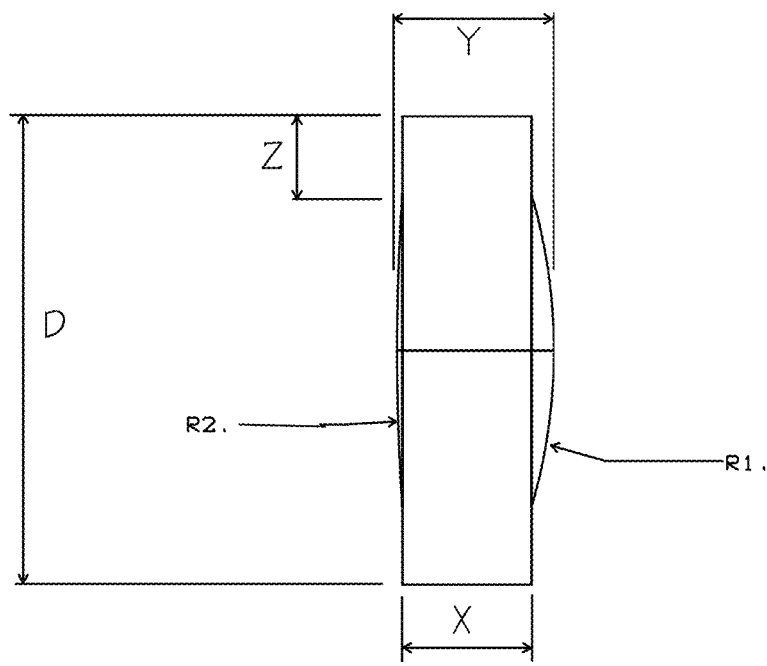
FIG. 25 is a side elevation of the lens.

A ray trace of the optic path is shown in FIG. 24. The image sensor 490 is a CMOS image sensor with an active region of 140 pixels squared. Each pixel is 10 µm squared, with a fill factor of 93%. Turning to FIG. 25, the lens 488 is shown in detail. The dimensions are:

D=3 mm
R1=3.593 mm
R2=15.0 mm
X=0.8246 mm
Y=10 mm
Z=0.25 mm

This gives a focal length of 6.15 mm and transfers the image from the object plane (tagged surface 548) to the image plane (image sensor 490) with the correct sampling frequency to successfully decode all images over the specified pitch, roll and yaw ranges. The lens 488 is biconvex, with the most curved surface facing the image sensor. The minimum imaging field of view 430 required to guarantee acquisition of sufficient tag data with each interaction is dependent on the specific coding pattern. The required field of view for the coding pattern of the present invention is described in Section 2.10.

The required paraxial magnification of the optical system is defined by the minimum spatial sampling frequency of 2.25 pixels per macrodot for the fully specified tilt range of the pen 400, for the image sensor 490 of 10 µm pixels. Typically, the imaging system employs a paraxial magnification of 0.225, the ratio of the diameter of the inverted image at the image sensor to the diameter of the field of view at the object plane, on an image sensor 490 of minimum 128×128 pixels. The image sensor 490 however is 140×140 pixels, in order to accommodate manufacturing tolerances. This allows up to +/−120 µm (12 pixels in each direction in the plane of the image sensor) of misalignment between the optical axis and the image sensor axis without losing any of the information in the field of view.

The lens 488 is made from Poly-methyl-methacrylate (PMMA), typically used for injection moulded optical components. PMMA is scratch resistant, and has a refractive index of 1.49, with 90% transmission at 810 nm. The lens is biconvex to assist moulding precision and features a mounting surface to precisely mate the lens with the optical barrel molding 492.

A 0.8 mm diameter aperture 494 is used to provide the depth of field requirements of the design.

The specified tilt range of the pen is 15.0 to 45.0 degree pitch, with a roll range of 30.0 to 30.0 degrees. Tilting the pen through its specified range moves the tilted object plane up to 6.3 mm away from the focal plane. The specified aperture thus provides a corresponding depth of field of /6.5 mm, with an acceptable blur radius at the image sensor of 16 µm.

Due to the geometry of the pen design, the pen operates correctly over a pitch range of 33.0 to 45.0 degrees.

Figure 26:
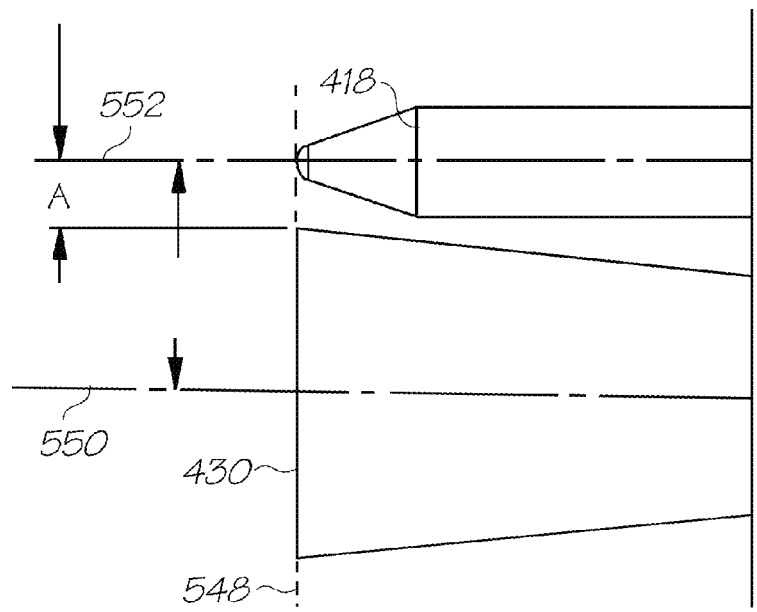
FIG. 26 is a side elevation of the nib and the field of view of the optical sensor.

Referring to FIG. 26, the optical axis 550 is pitched 0.8 degrees away from the nib axis 552. The optical axis and the nib axis converge toward the paper surface 548. With the nib axis 552 perpendicular to the paper, the distance A between the edge of the field of view 430 closest to the nib axis and the nib axis itself is 1.2 mm.

The longpass IR filter 432 is made of CR-39, a lightweight thermoset plastic heavily resistant to abrasion and chemicals such as acetone. Because of these properties, the filter also serves as a window. The filter is 1.5 mm thick, with a refractive index of 1.50. Each filter may be easily cut from a large sheet using a $CO_2$ laser cutter.

3.6 Electronics Design

TABLE 11

| Electrical Specifications | |
|---|---|
| Processor | ARM7 (Atmel AT91FR40162) running at 80 MHz with 256 kB SRAM and 2 MB flash memory |
| Digital ink storage capacity | 5 hours of writing |
| Bluetooth Compliance | 1.2 |
| USB Compliance | 1.1 |
| Battery standby time | 12 hours (cap off), >4 weeks (cap on) |
| Battery writing time | 4 hours of cursive writing (81% pen down, assuming easy offload of digital ink) |
| Battery charging time | 2 hours |
| Battery Life | Typically 300 charging cycles or 2 years (whichever occurs first) to 80% of initial capacity. |
| Battery Capacity/Type | ~340 mAh at 3.7 V, Lithium-ion Polymer (LiPo) |

Figure 27:
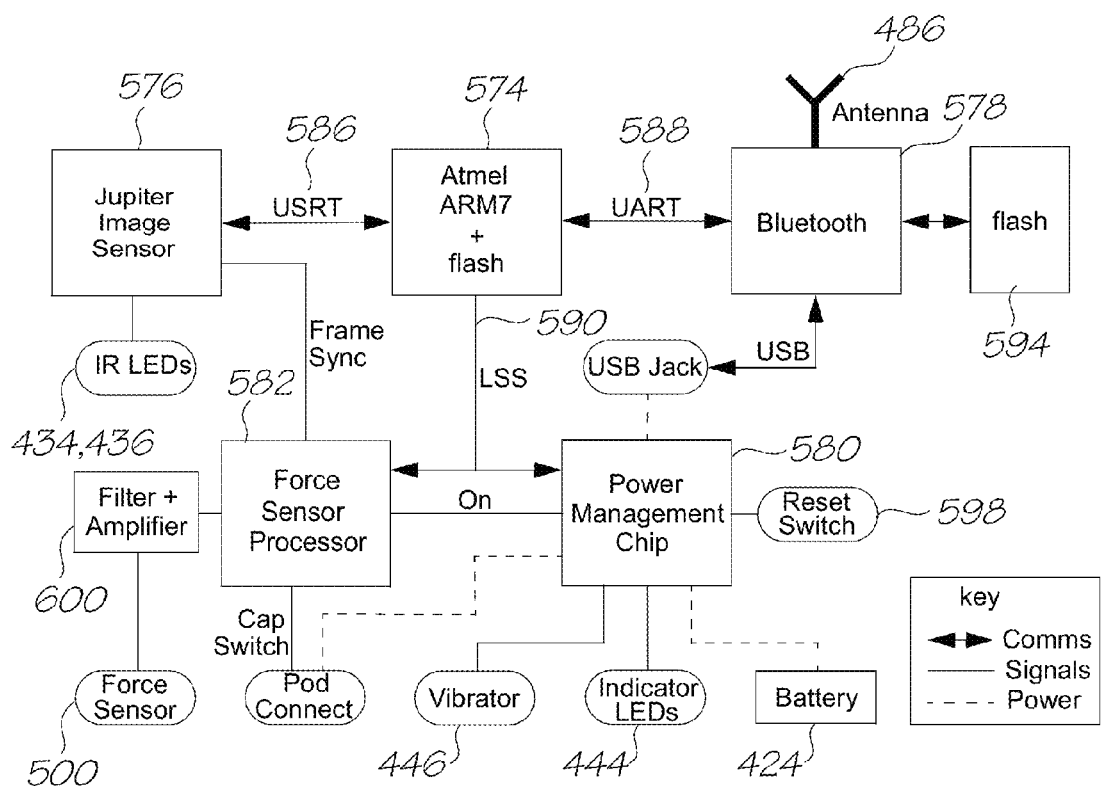
FIG. 27 is a block diagram of the pen electronics.

FIG. 27 is a block diagram of the pen electronics. The electronics design for the pen is based around five main sections. These are:

the main ARM7 microprocessor 574,
the image sensor and image processor 576,
the Bluetooth communications module 578,
the power management unit IC (PMU) 580 and
the force sensor microprocessor 582.

3.6.1 Microprocessor

The pen uses an Atmel AT91FR40162 microprocessor (see Atmel, AT91 ARM Thumb Microcontrollers—AT91FR40162 Preliminary, http://www.keil.com/dd/docs/datashts/atmel/at91fr40162.pdf) running at 80 MHz. The AT91FR40162 incorporates an ARM7 microprocessor, 256 kBytes of on-chip single wait state SRAM and 2 MBytes of external flash memory in a stack chip package.

This microprocessor 574 forms the core of the pen 400. Its duties include:

setting up the Jupiter image sensor 584,
decoding images of Netpage coding pattern (see Section 2.10), with assistance from the image processing features of the image sensor 584, for inclusion in the digital ink stream along with force sensor data received from the force sensor microprocessor 582,
setting up the power management IC (PMU) 580,
compressing and sending digital ink via the Bluetooth communications module 578, and
programming the force sensor microprocessor 582.

The ARM7 microprocessor 574 runs from an 80 MHz oscillator. It communicates with the Jupiter image sensor 576 using a Universal Synchronous Receiver Transmitter (USRT) 586 with a 40 MHz clock. The ARM7 574 communicates with the Bluetooth module 578 using a Universal Asynchronous Receiver Transmitter (UART) 588 running at 115.2 kbaud. Communications to the PMU 580 and the Force Sensor microProcessor (FSP) 582 are performed using a Low Speed Serial bus (LSS) 590. The LSS is implemented in software and uses two of the microprocessor's general purpose IOs.

The ARM7 microprocessor 574 is programmed via its JTAG port.

3.6.2 Image Sensor

The 'Jupiter' Image Sensor 584 (see US Publication No. 2005/0024510, the contents of which are incorporated herein by reference) contains a monochrome sensor array, an analogue to digital converter (ADC), a frame store buffer, a simple image processor and a phase lock loop (PLL). In the pen, Jupiter uses the USRT's clock line and its internal PLL to generate all its clocking requirements. Images captured by the sensor array are stored in the frame store buffer. These images are decoded by the ARM7 microprocessor 574 with help from the 'Callisto' image processor contained in Jupiter. The Callisto image processor performs, inter alia, low-pass filtering of captured images (see Section 2.10 and US Publication No. 2005/0024510) before macrodot sampling and decoding by the microprocessor 574.

Jupiter controls the strobing of two infrared LEDs 434 and 436 at the same time as its image array is exposed. One or other of these two infrared LEDs may be turned off while the image array is exposed to prevent specular reflection off the paper that can occur at certain angles.

3.6.3 Bluetooth Communications Module

The pen uses a CSR BlueCore4-External device (see CSR, BlueCore4-External Data Sheet rev c, 6-Sep.-2004) as the Bluetooth controller 578. It requires an external 8 Mbit flash memory device 594 to hold its program code. The BlueCore4 meets the Bluetooth v1.2 specification and is compliant to v0.9 of the Enhanced Data Rate (EDR) specification which allows communication at up to 3 Mbps.

A 2.45 GHz chip antenna 486 is used on the pen for the Bluetooth communications.

The BlueCore4 is capable of forming a UART to USB bridge. This is used to allow USB communications via data/power socket 458 at the top of the pen 456.

Alternatives to Bluetooth include wireless LAN and PAN standards such as IEEE 802.11 (Wi-Fi) (see IEEE, 802.11 Wireless Local Area Networks, http://grouper.ieee.org/groups/802/11/index.html), IEEE 802.15 (see IEEE, 802.15 Working Group for WPAN, http://grouperieee.org/groups/802/15/index.html), ZigBee (see ZigBee Alliance, http://www.zigbee.org), and WirelessUSB Cypress (see WirelessUSB LR 2.4-GHz DSSS Radio SoC, http://www.cypress.com/cfuploads/img/products/cywusb6935.pdf), as well as mobile standards such as GSM (see GSM Association, http://www.gsmworld.com/index.shtml), GPRS/EDGE, GPRS Platform, http://www.gsmworld.com/technology/gprs/index.shtml), CDMA (see CDMA Development Group, http://www.cdg.org/, and Qualcomm, http://www.qualcomm.com), and UMTS (see 3rd Generation Partnership Project (3GPP), http://www.3gpp.org).

3.6.4 Power Management Chip

The pen uses an Austria Microsystems AS3603 PMU 580 (see Austria Microsystems, AS3603 Multi-Standard Power Management Unit Data Sheet v2.0). The PMU is used for battery management, voltage generation, power up reset generation and driving indicator LEDs and the vibrator motor.

The PMU 580 communicates with the ARM7 microprocessor 574 via the LSS bus 590.

3.6.5 Force Sensor Subsystem

The force sensor subsystem comprises a custom Hokuriku force sensor 500 (based on Hokuriku, HFD-500 Force Sensor, http://www.hdk.co.jp/pdf/eng/e1381AA.pdf), an amplifier and low pass filter 600 implemented using op-amps and a force sensor microprocessor 582.

The pen uses a Silicon Laboratories C8051F330 as the force sensor microprocessor 582 (see Silicon Laboratories, C8051F330/1 MCU Data Sheet, rev 1.1). The C8051F330 is an 8051 microprocessor with on chip flash memory, 10 bit ADC and 10 bit DAC. It contains an internal 24.5 MHz oscillator and also uses an external 32.768 kHz tuning fork.

The Hokuriku force sensor 500 is a silicon piezoresistive bridge sensor. An op-amp stage 600 amplifies and low pass (anti-alias) filters the force sensor output. This signal is then sampled by the force sensor microprocessor 582 at 5 kHz.

Alternatives to piezoresistive force sensing include capacitive and inductive force sensing (see Wacom, "Variable capacity condenser and pointer", US Patent Application 20010038384, filed 8 Nov. 2001, and Wacom, Technology, http://www.wacom-components.com/english/tech.asp).

The force sensor microprocessor 582 performs further (digital) filtering of the force signal and produces the force sensor values for the digital ink stream. A frame sync signal from the Jupiter image sensor 576 is used to trigger the generation of each force sample for the digital ink stream. The temperature is measured via the force sensor microprocessor's 582 on chip temperature sensor and this is used to compensate for the temperature dependence of the force sensor and amplifier. The offset of the force signal is dynamically controlled by input of the microprocessor's DAC output into the amplifier stage 600.

The force sensor microprocessor 582 communicates with the ARM7 microprocessor 574 via the LSS bus 590. There are two separate interrupt lines from the force sensor microprocessor 582 to the ARM7 microprocessor 574. One is used to indicate that a force sensor sample is ready for reading and the other to indicate that a pen down/up event has occurred.

The force sensor microprocessor flash memory is programmed in-circuit by the ARM7 microprocessor 574.

The force sensor microprocessor 582 also provides the real time clock functionality for the pen 400. The RTC function is performed in one of the microprocessor's counter timers and runs from the external 32.768 kHz tuning fork. As a result, the force sensor microprocessor needs to remain on when the cap 472 is on and the ARM7 574 is powered down. Hence the force sensor microprocessor 582 uses a low power LDO separate from the PMU 580 as its power source. The real time clock functionality includes an interrupt which can be programmed to power up the ARM7 574.

The cap switch 602 is monitored by the force sensor microprocessor 582. When the cap assembly 472 is taken off (or there is a real time clock interrupt), the force sensor microprocessor 582 starts up the ARM7 572 by initiating a power on and reset cycle in the PMU 580.

3.7 Pen Software

The Netpage pen software comprises that software running on microprocessors in the Netpage pen 400 and Netpage pod.

The pen contains a number of microprocessors, as detailed in Section 3.6. The Netpage pen software includes software running on the Atmel ARM7 CPU 574 (hereafter CPU), the Force Sensor microprocessor 582, and also software running in the VM on the CSR BlueCore Bluetooth module 578 (hereafter pen BlueCore). Each of these processors has an associated flash memory which stores the processor specific software, together with settings and other persistent data. The pen BlueCore 578 also runs firmware supplied by the module manufacturer, and this firmware is not considered a part of the Netpage pen software.

The pod contains a CSR BlueCore Bluetooth module (hereafter pod BlueCore). The Netpage pen software also includes software running in the VM on the pod BlueCore.

As the Netpage pen 400 traverses a Netpage tagged surface 548, a stream of correlated position and force samples are produced. This stream is referred to as DInk. Note that DInk may include samples with zero force (so called "Hover DInk") produced when the Netpage pen is in proximity to, but not marking, a Netpage tagged surface.

The CPU component of the Netpage pen software is responsible for DInk capture, tag image processing and decoding (in conjunction with the Jupiter image sensor 576), storage and offload management, host communications, user feedback and software upgrade. It includes an operating system (RTOS) and relevant hardware drivers. In addition, it provides a manufacturing and maintenance mode for calibration, configuration or detailed (non-field) fault diagnosis. The Force Sensor microprocessor 582 component of the Netpage pen software is responsible for filtering and preparing force samples for the main CPU. The pen BlueCore VM software is responsible for bridging the CPU UART 588 interface to USB when the pen is operating in tethered mode. The pen BlueCore VM software is not used when the pen is operating in Bluetooth mode.

The pod BlueCore VM software is responsible for sensing when the pod is charging a pen 400, controlling the pod LEDs appropriately, and communicating with the host PC via USB.

For a detailed description of the software modules, reference is made to US Publication No. 2006/0028459, the contents of which are herein incorporated by reference.

The present invention has been described with reference to a preferred embodiment and number of specific alternative embodiments. However, it will be appreciated by those skilled in the relevant fields that a number of other embodiments, differing from those specifically described, will also fall within the spirit and scope of the present invention. Accordingly, it will be understood that the invention is not intended to be limited to the specific embodiments described in the present specification, including documents incorporated by cross-reference as appropriate. The scope of the invention is only limited by the attached claims.

The invention claimed is:

1. A method of decoding a coding pattern disposed on or in a substrate, said method comprising the steps of:
   (a) operatively positioning an optical reader relative to a surface of said substrate;
   (b) capturing an image of a portion of said coding pattern, said coding pattern comprising a plurality of square tags of length l identifying two-dimensional location coordinates, each tag comprising:
   a plurality $n_1$ of x-coordinate data symbols encoding a respective $(n_2, k)$ Reed-Solomon code for an x-coordinate;
   a plurality $n_1$ of y-coordinate data symbols encoding a respective $(n_2, k)$ Reed-Solomon code for a y-coordinate;
   a number z of said x-coordinate data symbols positioned in a central column of width q in each tag with a remaining $(n_1-z)$ x-coordinate data symbols distributed evenly on either side of said central column; and
   a number z of said y-coordinate data symbols positioned in a central row of said tag of width q with a remaining $(n_1-z)$ y-coordinate data symbols distributed evenly above and below said central row, wherein $n_1 \geq n_2$ and $z \leq 1$;
   (c) sampling and decoding at least one of:
   x-coordinate data symbols within said imaged portion; and
   y-coordinate data symbols within said imaged portion, wherein said imaged portion has a diameter of at least $(l+q)\sqrt{2}$ and less than $(2l)\sqrt{2}$ and is guaranteed to contain at least $(n_1+z)/2$ data symbols from each of said Reed-Solomon codes, and wherein one or more symbol errors are correctable in each of said codes during said decoding.

2. The method of claim 1, wherein $n_1=n_2$ and none of said x-coordinate or y-coordinate data symbols is replicated within each tag.

3. The method of claim 1, wherein $n_2 > 2k$ and $z \geq k$.

4. The method of claim 1, wherein:
z is from 1 to 253;
k is from 1 to 253;
$n_1$ is from 3 to 255; and
$n_2$ is from 3 to 255.

5. The method of claim 4, wherein up to 126 symbol errors are corrected during said decoding.

6. The method of claim 1, wherein said sampled x-coordinate data symbols and y-coordinate data symbols within said imaged portion define respective sampled x-coordinate and y-coordinate codewords, and wherein any missing coordinate data symbols from respective $(n_2, k)$ Reed-Solomon codes are treated as erasures in said sampled codewords.

7. The method of claim 6, wherein a number of said missing coordinate data symbols from respective $(n_2, k)$ Reed-Solomon codes varies from 0 to $(n_1-z)/2$ depending on an alignment of said imaged portion with a tag to be decoded.

8. The method of claim 1, wherein each data symbol is encoded using multi-pulse position modulation.

9. The method of claim 8, wherein each data symbol is represented by d macrodots, each of said d macrodots occupying a respective position from a plurality of predetermined possible positions p, the respective positions of said d macrodots representing one of a plurality of possible data values, wherein p>d.

10. The method of claim 9, wherein d is an integer value of 2 to 6 and p is an integer value of 4 to 12.

11. The method of claim 9, wherein each data symbol provides i possible symbol values, and wherein any unused symbol values are treated as erasures.

12. The method of claim 9, wherein q=2 s, 3 s, 4 s or 5 s, and s is defined as a spacing between adjacent macrodots.

13. The method of claim 1, wherein said coding pattern comprises a plurality of target elements defining a target grid, said target grid comprising a plurality of grid cells, wherein neighboring grid cells share target elements and wherein each tag is defined by a plurality of contiguous grid cells.

14. The method of claim 13, wherein each grid cell defines a symbol group containing a plurality of data symbols, wherein each symbol group comprises at least one of said x-coordinate symbols or at least one of said y-coordinate symbols.

15. The method of claim 14, wherein each tag comprises one or more common Reed-Solomon codewords identifying a region identity associated with said surface, each common codeword being common to a plurality of contiguous tags and each common codeword comprising a respective set of common data symbols, wherein said method comprises the further steps of:
sampling and decoding common data symbols within said imaged portion; and
determining a region identity using said decoded common data symbols.

16. The method of claim 14, wherein each symbol group comprises one or more registration symbols, said registration symbols identifying one or more of:
a tag encoding format;
a translation of a symbol group relative to a tag containing said symbol group;
an orientation of a layout of said data symbols with respect to said target grid; and
a flag, wherein said method comprises the further step of:
sampling and decoding registration symbols within the imaged portion; and
using the decoded registration symbols to decode the x-coordinate data symbols and y-coordinate data symbols.

17. The method of claim 16, wherein said method comprises the further step of:
using the decoded registration symbols to determine a tag encoding format for said coding pattern, said tag encoding format identifying a number of macrodots contained in each of said data symbols.

18. The method of claim 16, wherein said method comprises the further step of:
using the decoded registration symbols to determine whether at least one tag within said imaged portion is flagged or unflagged; and
providing feedback to a user in the event that the tag is flagged.

19. A system which decodes a coding pattern, said system comprising:
(A) a substrate having a coding pattern disposed thereon or therein, said coding pattern comprising a plurality of square tags of length l identifying two-dimensional location coordinates, each tag comprising:
a plurality $n_1$ of x-coordinate data symbols encoding a respective $(n_2, k)$ Reed-Solomon code for an x-coordinate;
a plurality $n_1$ of y-coordinate data symbols encoding a respective $(n_2, k)$ Reed-Solomon code for a y-coordinate;
a number z of said x-coordinate data symbols positioned in a central column of width q in each tag with a remaining $(n_1-z)$ x-coordinate data symbols distributed evenly on either side of said central column; and
a number z of said y-coordinate data symbols positioned in a central row of said tag of width q with a remaining $(n_1-z)$ y-coordinate data symbols distributed evenly above and below said central row, wherein $n_1 \geq n_2$ and $z \geq k$; and
(B) an optical reader comprising:
an image sensor which captures an image of a portion of said coding pattern, said image sensor having a field of view with a diameter of at least $(l+q)\sqrt{2}$ and less than $(2l)\sqrt{2}$; and
a processor configured to the steps of:
(i) sampling at least $(n_1+z)/2$ data symbols from at least one of said Reed-Solomon codes; and
(ii) decoding at least one of: said x-coordinate data symbols within said imaged portion; and said y-coordinate data symbols within said imaged portion,
wherein said processor is configured to correct one or more symbol errors in each of said codes when decoding said x-coordinate and y-coordinate data symbols.

20. An optical reader which decodes a coding pattern disposed on or in a substrate, said coding pattern comprising a plurality of square tags of length l identifying two-dimensional location coordinates, each tag comprising:
a plurality $n_1$ of x-coordinate data symbols encoding a respective $(n_2, k)$ Reed-Solomon code for an x-coordinate;
a plurality $n_1$ of y-coordinate data symbols encoding a respective $(n_2, k)$ Reed-Solomon code for a y-coordinate;
a number z of said x-coordinate data symbols positioned in a central column of width q in each tag with a remaining $(n_1-z)$ x-coordinate data symbols distributed evenly on either side of said central column; and
a number z of said y-coordinate data symbols positioned in a central row of said tag of width q with a remaining $(n_1-z)$ y-coordinate data symbols distributed evenly above and below said central row, wherein $n_1 \geq n_2$ and $z \geq k$;
said optical reader comprising:
an image sensor which captures an image of a portion of said coding pattern, said image sensor having a field of view with a diameter of at least $(l+q)\sqrt{2}$ and less than $(2l)\sqrt{2}$; and
a processor configured to perform the steps of:
(i) sampling at least $(n_1+z)/2$ data symbols from at least one of said Reed-Solomon codes; and
(ii) decoding at least one of: said x-coordinate data symbols within said imaged portion; and said y-coordinate data symbols within said imaged portion,
wherein said processor is configured to correct one or more symbol errors in each of said codes when decoding said x-coordinate and y-coordinate data symbols.

* * * * *